United States Patent
Tsuda

(10) Patent No.: US 10,580,785 B2
(45) Date of Patent: Mar. 3, 2020

(54) SEMICONDUCTOR DEVICE AND MANUFACTURING METHOD FOR SEMICONDUCTOR DEVICE

(71) Applicant: Renesas Electronics Corporation, Koutou-ku, Tokyo (JP)

(72) Inventor: Shibun Tsuda, Tokyo (JP)

(73) Assignee: Renesas Electronics Corporation, Tokyo (JP)

(*) Notice: Subject to any disclaimer, the term of this patent is extended or adjusted under 35 U.S.C. 154(b) by 0 days.

(21) Appl. No.: 15/916,241

(22) Filed: Mar. 8, 2018

(65) Prior Publication Data

US 2018/0342526 A1    Nov. 29, 2018

(30) Foreign Application Priority Data

May 26, 2017   (JP) .................................. 2017-104342

(51) Int. Cl.
*H01L 29/78* (2006.01)
*H01L 27/11573* (2017.01)
(Continued)

(52) U.S. Cl.
CPC .... *H01L 27/1157* (2013.01); *H01L 21/76232* (2013.01); *H01L 21/823431* (2013.01); *H01L 27/0886* (2013.01); *H01L 27/11536* (2013.01); *H01L 27/11573* (2013.01); *H01L 29/40117* (2019.08); *H01L 29/42344* (2013.01); *H01L 29/66833* (2013.01); *H01L 29/7851* (2013.01); *H01L 29/7853* (2013.01);
(Continued)

(58) Field of Classification Search
CPC .................................. H01L 27/11536

USPC .................................................. 257/324, 326
See application file for complete search history.

(56) References Cited

U.S. PATENT DOCUMENTS 7,504,689 B2    3/2009  Hisamoto et al.
9,842,845 B1 *  12/2017 Melde ............... H01L 21/28035
(Continued)

FOREIGN PATENT DOCUMENTS

EP    3144960 A2    3/2017
JP    2006-041354 A   2/2006

OTHER PUBLICATIONS

Extended European search report dated Oct. 1, 2018, in European Patent Application No. 18162904.9.

*Primary Examiner* — David Vu
*Assistant Examiner* — Brandon C Fox
(74) *Attorney, Agent, or Firm* — SGPatents PLLC

(57) ABSTRACT

A semiconductor device of the present invention includes: an element isolation part which is disposed between fins and whose height is lower than the height of each fin; a memory gate electrode placed over the fins and the element isolation part with a memory gate insulating film having a charge storage part in between; and a control gate electrode disposed in line with the memory gate electrode. The height of the element isolation part below the memory gate electrode is higher than the height of the element isolation part below the control gate electrode. A mismatch between electron injection and hole injection is improved, rewriting operation speed is accelerated, and reliability is enhanced by making the height of the element isolation part below the memory gate electrode higher than the height of the element isolation part below the control gate electrode as mentioned above.

20 Claims, 33 Drawing Sheets

(51) Int. Cl.
*H01L 27/1157* (2017.01)
*H01L 21/762* (2006.01)
*H01L 29/792* (2006.01)
*H01L 29/423* (2006.01)
*H01L 21/8234* (2006.01)
*H01L 27/088* (2006.01)
*H01L 29/66* (2006.01)
*H01L 21/28* (2006.01)
*H01L 27/11536* (2017.01)
*H01L 29/49* (2006.01)

(52) U.S. Cl.
CPC ........ *H01L 29/7856* (2013.01); *H01L 29/792* (2013.01); *H01L 29/4916* (2013.01); *H01L 29/785* (2013.01)

(56) References Cited

U.S. PATENT DOCUMENTS

| | | | |
|---|---|---|---|
| 2010/0193857 A1* | 8/2010 | Nakagawa | H01L 27/11521 257/324 |
| 2015/0270279 A1* | 9/2015 | Arigane | H01L 27/11568 257/324 |
| 2018/0033866 A1* | 2/2018 | Liao | H01L 21/28123 |
| 2018/0145143 A1* | 5/2018 | Chen | H01L 21/823431 |

* cited by examiner

FIG. 29
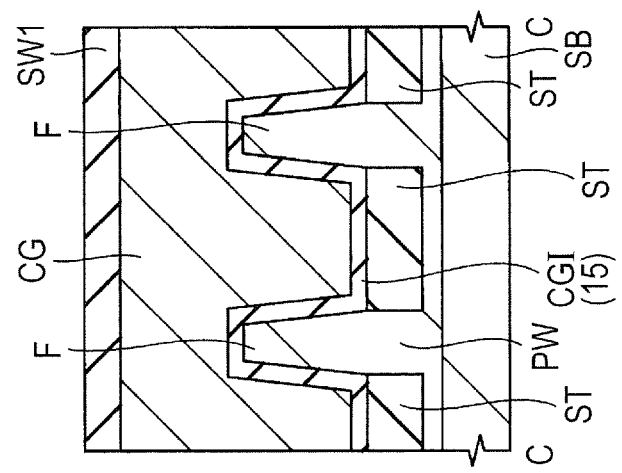
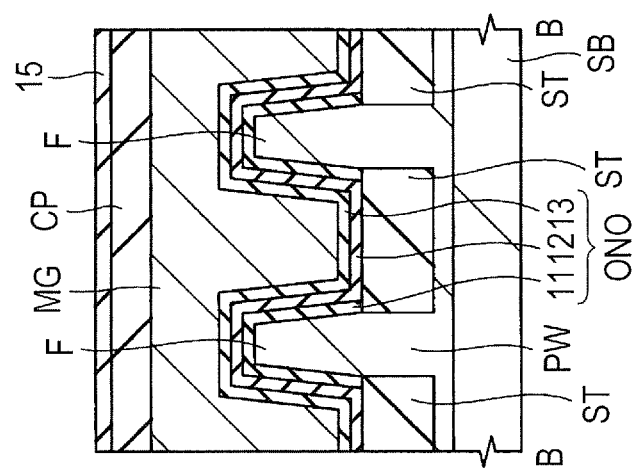
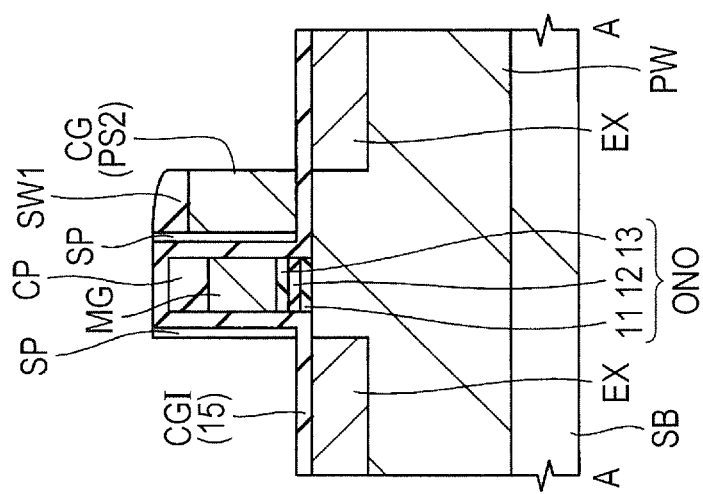

SEMICONDUCTOR DEVICE AND MANUFACTURING METHOD FOR SEMICONDUCTOR DEVICE

CROSS-REFERENCE TO RELATED APPLICATIONS

The disclosure of Japanese Patent Application No. 2017-104342 filed on May 26, 2017 including the specification, drawings and abstract is incorporated herein by reference in its entirety.

SUMMARY

The present invention relates to a semiconductor device and a manufacturing method for the semiconductor device and is suitably applicable to, for example, a semiconductor device including a nonvolatile memory of a FIN structure.

In the field of LSIs (Large Scale Integrations) using silicon, in recent years, the dimensions of MISFET (Metal Insulator Semiconductor Field Effect Transistor), one of their components, especially, gate lengths of gate electrodes have been increasingly reduced. This miniaturization of MISFETs has been pushed forward in accordance with scaling rules. However, various problems have presented themselves as the generations of devices go by and it has been difficult to suppress the short channel effect in MISFETs and at the same time ensure current driving force. For this reason, research and development have been actively pursued aiming at devices of a novel structure replacing planar (flat-type) MISFETs in the related art.

The FINFET is one of the above-mentioned devices of a novel structure and is intended to enhance current driving force by utilizing a side face of FIN as a channel.

As a kind of nonvolatile memories, there is a memory cell including a split gate-type cell using a MONOS (Metal-Oxide-Nitride-Oxide-Semiconductor) film. This memory cell is comprised of two MISFETs: a control transistor having a control gate electrode and a memory transistor having a memory gate electrode. The characteristics of a memory can also be enhanced by applying a FIN structure to these transistors.

Japanese Unexamined Patent Application Publication No. 2006-41354 (Patent Document 1) discloses a technology in which a memory gate is formed over a convex substrate in a nonvolatile semiconductor device of a split gate structure and a side face thereof is utilized as a channel.

RELATED ART DOCUMENT

Patent Document

[Patent Document 1] Japanese Unexamined Patent Application Publication No. 2006-41354

SUMMARY

The present inventors are involved in the research and development of such a semiconductor device having a nonvolatile memory cell as mentioned above and are considering adopting the above-mentioned FIN structure to further enhance the characteristics of memory cells. In the course of the process of the research and development, it turned out that there was room for further improvement of a structure and a manufacturing method to adopt a FIN structure in nonvolatile memory cells.

Other problems and novel features will be apparent from the description in the present specification and accompanying drawings.

Following is a brief description of the overviews of representative embodiments among those disclosed in the present application:

A semiconductor device described as an embodiment disclosed in the present application includes: a first fin, a second fin, and an element isolation part placed between these fins and lower in height than the first fin and the second fin. The semiconductor device further includes: a first gate electrode placed over the first fin, the element isolation part, and the second fin with a first gate insulating film having a charge storage part in between; and a second gate electrode placed over the first fin, the element isolation part, and the second fin with a second gate insulating film in between and in line with the first gate electrode. The height of the element isolation part below the first gate electrode is higher than the height of the element isolation part below the second gate electrode.

A manufacturing method for a semiconductor device described as an embodiment disclosed in the present application includes the steps of: (a) forming an isolation trench between a first fin formation region and a second fin formation region; (b) embedding an isolation insulating film in the isolation trench to form an element isolation part; and (c) depressing a surface of the element isolation part. The manufacturing method further includes the step of: (d) forming a first insulating film having a charge storage part and forming and processing a first conductive film over the first insulating film to form a first conductive film located above the first fin, the element isolation part, and the second fin and extending in a direction intersecting the first fin. The manufacturing method further includes the step of: (e) forming a second insulating film and forming and processing a second conductive film over the second insulating film to form a second conductive film located above the first fin, the element isolation part, and the second fin and extending in a direction intersecting the first fin. The step (e) is performed after the step (d) and after the step (d), the height of the element isolation part below the first conductive film is higher than the height of the element isolation part below the second conductive film.

According to a semiconductor device in a representative embodiment disclosed in the present application, the characteristics of the semiconductor device can be enhanced.

According to a manufacturing method for a semiconductor device in a representative embodiment disclosed in the present application, a semiconductor device excellent in characteristics can be manufactured.

BRIEF DESCRIPTION OF THE DRAWINGS

FIG. 29 is a sectional view of a semiconductor device in the first embodiment in the course of a formation process;

DETAILED DESCRIPTION

Figure 1:
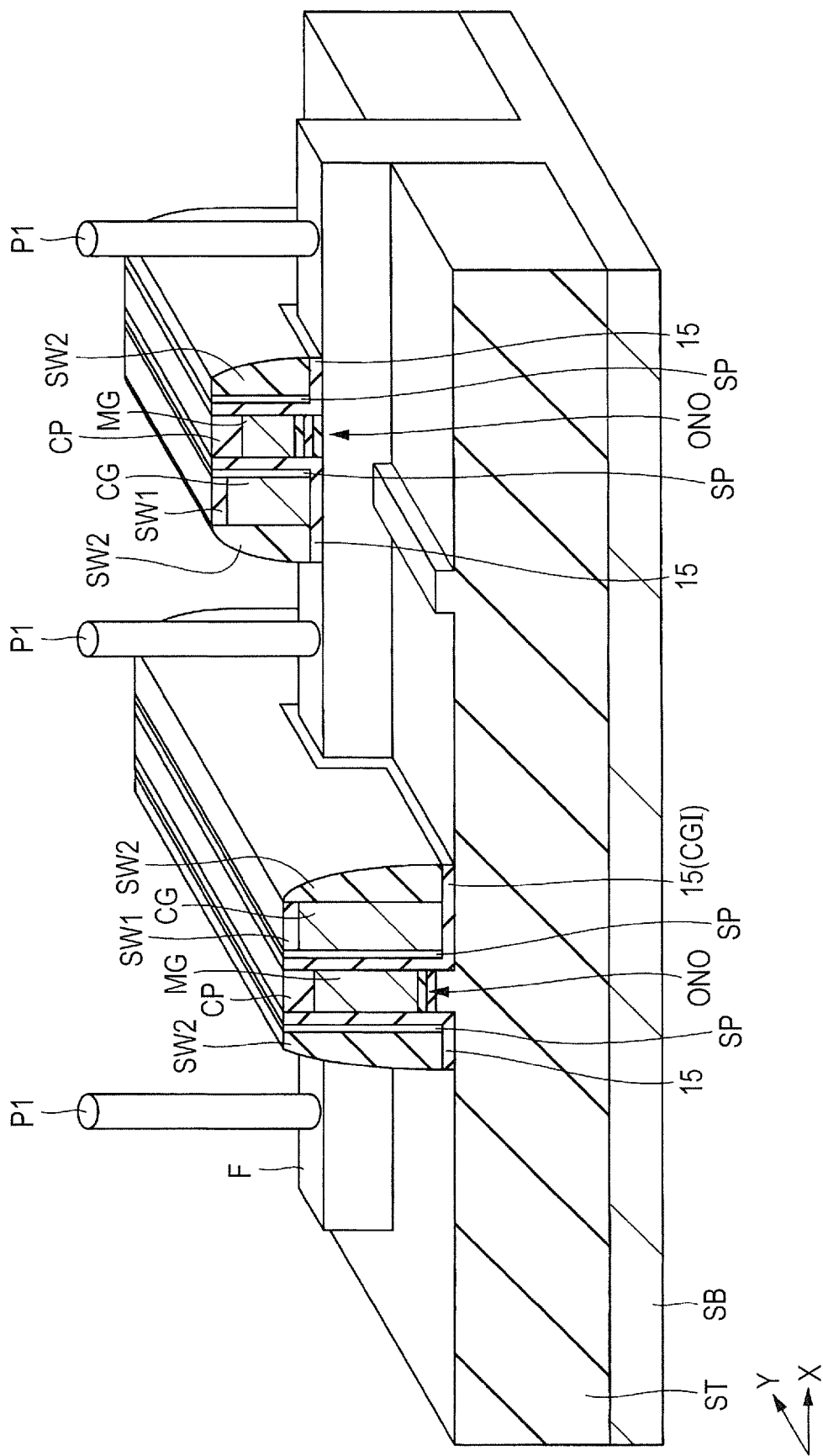
FIG. 1 is a perspective view illustrating the configuration of a memory cell of a semiconductor device in a first embodiment.

In the following description of each embodiment, the embodiment will be divided into multiple sections or embodiments if necessary for the sake of convenience. These sections and embodiments are irrelevant to one another unless explicitly stated otherwise and one is a modification to or an application example, a detailed description, or a supplementary explanation of part or all of another. When a number of elements or the like (including a number of pieces, a numerical value, a quantity, a range, and the like) is referred to in the following description of each embodiment, the description is not limited to that specific number unless explicitly stated otherwise or the description is evidently limited to that specific number in principle. Any number not less or more than that specific number is acceptable.

In the following description of each embodiment, each constituent element (including constituent step and the like) thereof are not always indispensable unless explicitly stated otherwise or it is evidently considered to be indispensable in principle. Similarly, when a shape, positional relation, or the like of each constituent element or the like is referred to, those substantially approximate or similar to that shape or the like are included unless explicitly stated otherwise or it is evidently considered not to be so in principle. This is also the case with the above-mentioned number and the like (inducing a number of pieces, a numerical value, a quantity, a range, and the like).

Hereafter, a detailed description will be given to embodiments with reference to the drawings. In all the drawings illustrating the following embodiments, members having an identical function will be marked with identical or pertinent reference numerals and a repetitive description thereof will be omitted. When there are multiple similar members (parts), a symbol may be affixed to a generic reference numeral to indicate an individual or a specific part. With respect to the following embodiments, a description of an identical or a similar item will not be repeated as a rule unless especially necessary.

In a drawing referred to in connection with the following embodiments, hatching may be omitted for making the drawing more visible even though the drawing is a sectional view. Even a plan view may be hatched for making the drawing more visible.

In the following sectional views and plan views, the size of each part does not correspond to that of an actual device and a specific part may be depicted in relatively large size for making the drawing more understandable. Even when a sectional view and a plan view correspond to each other, a specific part may be depicted in relatively large size for making the drawings more understandable.

First Embodiment (Explanation of Structure)

Hereafter, a description will be given to a structure of a semiconductor device (nonvolatile memory device, semiconductor storage device) in this embodiment with reference to the drawings. The semiconductor device in this embodiment includes a split gate-type memory cell. That is, a memory cell in this embodiment includes a control transistor having a control gate electrode CG and a memory transistor coupled to the control transistor and having a memory gate electrode MG. Transistor cited here is also referred to as MISFET.

<Explanation of Structure of Memory Cell>

Figure 2:
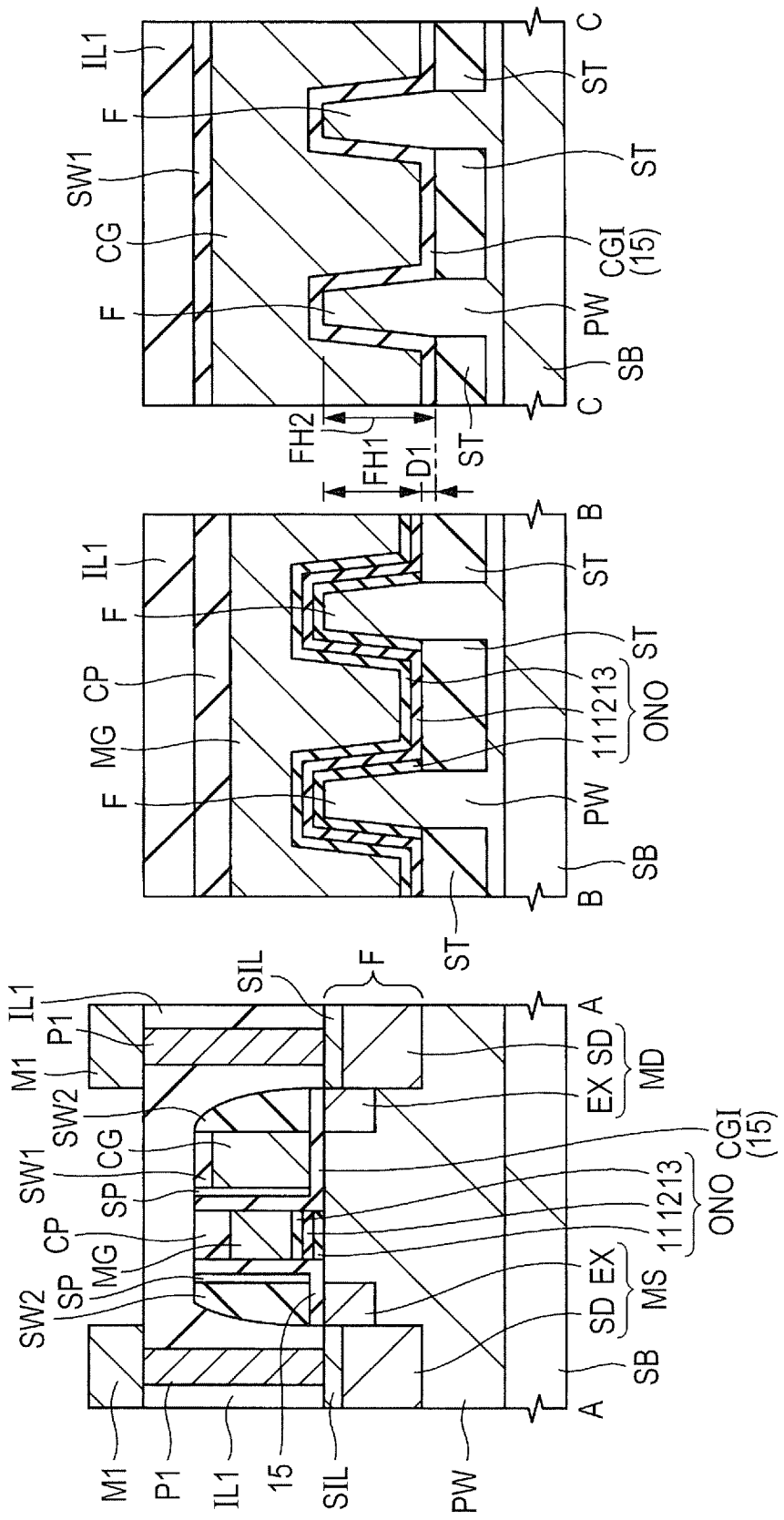
FIG. 2 is a sectional view illustrating the configuration of a memory cell of a semiconductor device in the first embodiment.
Figure 3:
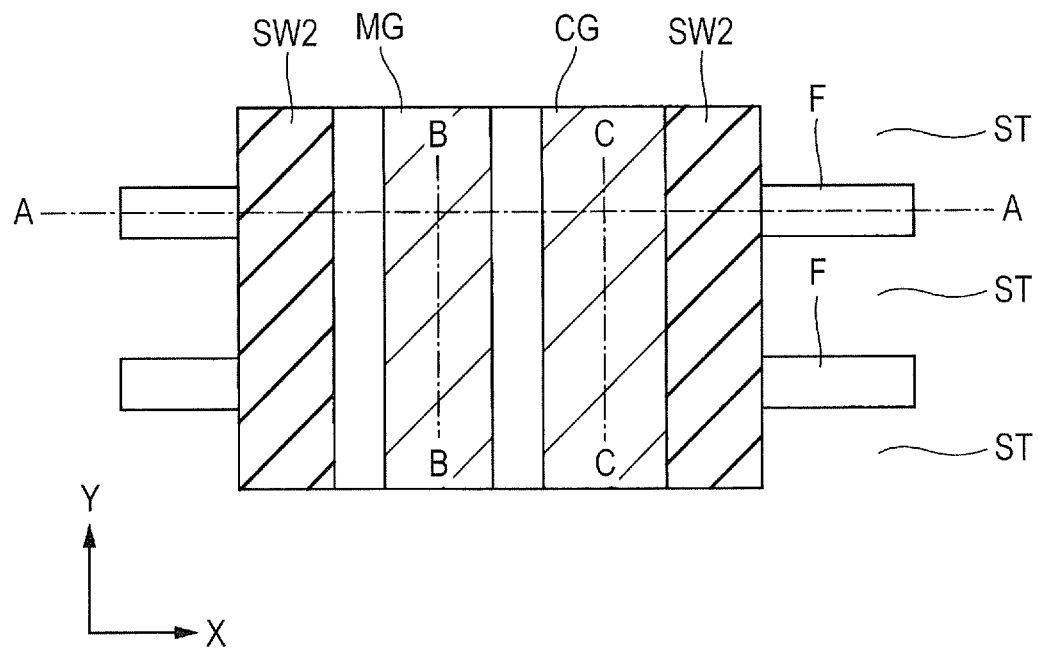
FIG. 3 is a plan view illustrating the configuration of a memory cell of a semiconductor device in the first embodiment.

FIG. 1 is a perspective view illustrating a configuration of a memory cell of the semiconductor device in this embodiment. FIG. 2 is a sectional view illustrating a memory cell of the semiconductor device in this embodiment and FIG. 3 is a plan view of the memory cell. The left sketch in FIG. 2 corresponds to a section taken along line A-A of FIG. 3; the center sketch corresponds to a section taken along line B-B of FIG. 3; and the right sketch corresponds to a section taken along line C-C of the FIG. 3. The B-B section is equivalent to a formation region of the memory gate electrode MG and the C-C section is equivalent to a formation region of the control gate electrode CG.

As illustrated in FIG. 1 to FIG. 3, the memory cell (memory element, element) is comprised of the control transistor having the control gate electrode CG and the memory transistor having the memory gate electrode MG.

Specifically, the memory cell includes: the control gate electrode CG placed above a semiconductor substrate SB (fins F); and the memory gate electrode MG placed above the semiconductor substrate SB (fins F) and adjoining to the control gate electrode CG. For example, the control gate electrode CG and the memory gate electrode MG are respectively formed of a silicon film.

In this embodiment, the control gate electrode CG and the memory gate electrode MG are placed over a fin F with a gate insulating film (CGI, ONO) in between. The fin F is comprised of the upper part of the semiconductor substrate SB. In other words, the semiconductor substrate SB has irregularities and the fin F is equivalent to a projection of the semiconductor substrate SB. As described later, the planar shape of the fin F is a line (a rectangle having the long sides in the X-direction) having a certain width (length in the Y-direction). (Refer to FIG. 3.)

A control gate insulating film CGI is placed between the control gate electrode CG and the semiconductor substrate SB (fins F). This control gate insulating film CGI is located between the control gate electrode CG and the semiconductor substrate SB (fins F) and between the control gate electrode CG and the memory gate electrode MG. The control gate insulating film CGI is formed of, for example, a silicon oxide film.

The memory cell further includes an insulating film ONO (11, 12, 13) located between the memory gate electrode MG and the semiconductor substrate SB (fins F). The insulating film ONO is comprised of, for example, a lower layer insulating film 11, an intermediate layer insulating film 12 located thereover, and an upper layer insulating film 13 located thereover. The intermediate layer insulating film 12 serves as a charge storage part (trap film). The lower layer insulating film 11 is formed of, for example, a silicon oxide film. The intermediate layer insulating film 12 is formed of, for example, a silicon nitride film. The upper layer insulating film 13 is formed of, for example, a silicon oxinitride film.

The memory cell further includes a drain region MD and a source region MS formed in a fin F of the semiconductor substrate SB. A side wall (side wall insulating film, side wall spacer) SW2 formed of an insulating film is formed in a side wall portion of a synthetic pattern of the memory gate electrode MG and the control gate electrode CG.

The drain region MD is comprised of an $n^+$-type semiconductor region SD and an $n^-$-type semiconductor region EX. The $n^-$-type semiconductor region EX is formed by self-alignment to a side wall of the control gate electrode CG. The $n^+$-type semiconductor region SD is formed by self-alignment to a side face of the side wall SW2 on the control gate electrode CG side and is deeper in junction depth and higher in impurity concentration than the $n^-$-type semiconductor region EX.

The source region MS is comprised of an $n^+$-type semiconductor region SD and an $n^-$-type semiconductor region EX. The $n^-$-type semiconductor region EX is formed by self-alignment to a side wall of a spacer SP of the memory gate electrode MG. The $n^+$-type semiconductor region SD is formed by self-alignment to a side face of the side wall SW2 on the memory gate electrode MG side and is deeper in junction depth and higher in impurity concentration than the $n^-$-type semiconductor region EX.

Such a source region (or a drain region) comprised of a low-concentration semiconductor region and a high-concentration semiconductor region as mentioned above is referred to as LDD (Lightly Doped Drain) structure.

In this specification, the drain region MD and the source region MS are defined on the basis of operating. Collectively, semiconductor regions to which a low voltage is applied during a readout operation described later will be referred to as source region MS and semiconductor regions to which a high voltage is applied during a readout operation will be referred to as drain region MD.

A metal silicide film SIL is formed in the upper parts of the drain region MD ($n^+$-type semiconductor region SD) and the source region MS ($n^+$-type semiconductor region SD). A cap insulating film CP is formed in the upper part of the memory gate electrode MG. A sidewall SW1 is formed in the upper part of the control gate electrode CG. The cap insulating film CP and the side wall SW1 are formed of, for example, a silicon nitride film.

An interlayer insulating film IL1 is formed over the memory cell. This film is formed of, for example, a silicon oxide film. A plug P1 is formed in the interlayer insulating film IL1 and a wiring M1 is formed over the plug P1.

In the left sketch in FIG. 2, only a section of one memory cell is depicted but multiple memory cells are placed in the memory region. For example, a memory cell (not shown) sharing the source region MS is placed on the left of the memory cell shown in the left sketch in FIG. 2 and a memory cell (not shown) sharing the drain region MD is placed on the right of the memory cell shown in the left sketch in FIG. 2. As mentioned above, the multiple memory cells are substantially symmetrically disposed with the source region MS or the drain region MD sandwiched in between. (Refer to FIG. 1.)

Hereafter, a description will be given to a planar layout of the memory cell with reference to FIG. 3. As illustrated in FIG. 3, multiple fins F (active regions) extending in the X-direction are linearly provided. The area between fins F is an element isolation part ST. The control gate electrode CG and memory gate electrode MG of the memory cell are extended in the Y-direction so as to intersect fins F. In other words, the control gate electrode CG is placed over the element isolation part ST between a fin F and a fin F with the control gate insulating film CGI in between and are extended in the Y-direction. The memory gate electrode MG is placed over the element isolation part ST between a fin F and a fin F with the memory gate insulating film ONO in between and are extended in the Y-direction. The control gate electrode CG and the memory gate electrode MG are disposed in line with each other.

The source region (MS, $n^+$-type semiconductor region SD) in a fin F and a source line are coupled with each other via a plug (contact plug, junction) P1. For example, a source line is extended in the Y-direction above a fin F such that the source line intersects the fin F and couples together the source regions (MS, $n^+$-type semiconductor regions SD) in the fin F. For example, a source line is a first-layer wiring M1. The drain region MD ($n^+$-type semiconductor region SD) in a fin F and a drain line are coupled with each other via the plug P1 and a plug P2 (not shown) coupled with the plug P1 via the wiring M1. The drain lines are disposed in the X-direction over the respective fins F such that the drain lines couple the plugs P1, P2 (not shown) over the drain regions MD disposed in line with one another in the X-direction. For example, a drain line is a second layer wiring (M2). As mentioned above, the memory cells are disposed in an array at intersections between source lines and drain lines.

(Memory Operation)

A description will be given to an example of a basic operation of the memory cell. The description will be given to three operations of the memory cell: (1) readout, (2) erasing, and (3) writing. However, these operations are variously defined and especially, erasing operation and writing operation may be defined as reverse operations.

It is assumed that: a voltage applied to the memory gate electrode MG of a memory cell (selected memory cell) is Vmg; a voltage applied to the source region MS is Vs; a voltage applied to the control gate electrode CG is Vcg; a voltage applied to the drain region MD is Vd; and a voltage applied to a p-type well PW is Vb. In this embodiment, injection of electrons into the silicon nitride film (12) as a charge storage part of the insulating film ONO (11, 12, 13) of a memory cell is defined as "writing" and injection of holes is defined as "erasing." Vdd described later is, for example, 1.5V.

For writing operation, a so-called SSI (Source Side Injection) writing scheme can be used. For example, writing is performed by applying voltages of Vd=0.5, Vcg=1V, Vmg=12V, Vs=6V, and Vb=0V to each part of the selected memory cell where writing is performed and injecting electrons into the silicon nitride film (12) of the selected memory cell.

At this time, hot electrons are produced in the channel region (between source and drain) below the area between the two gate electrodes (the memory gate electrode MG and the control gate electrode CG). The hot electrons are injected into the silicon nitride film (12) below the memory gate electrode MG. The injected hot electrons (electrons) are trapped at a trap level in the silicon nitride film (12) and as a result, the threshold voltage of the memory transistor is increased. That is, the memory transistor is brought into a writing state.

For erasing operation, a so-called BTBT Band-To-Band Tunneling) erasing scheme can be used. For example, voltages of Vd=0V, Vcg=0V, Vmg=−6V, Vs=6V, and Vb=0V are applied to each part of the selected memory cell where erasing is to be performed and holes are produced by a BTBT phenomenon to cause electric field acceleration. The holes are thereby injected into the silicon nitride film (12) of the selected memory cell to lower the threshold voltage of the memory transistor. That is, the memory transistor is brought into an erasing state.

For readout operation, for example, voltages of Vd=Vdd, Vcg=Vdd, Vmg=0V, Vs=0V, and Vb=0V are applied to each part of the selected memory cell where readout is to be performed. A readout state and a writing state can be discriminated from each other by setting a voltage Vmg applied to the memory gate electrode MG during readout to a value between the threshold voltage of the memory transistor in a writing state and the threshold voltage of the memory transistor in an erasing state.

In this embodiment, as shown in FIG. 1 and FIG. 2, the height of the element isolation part ST below the memory gate electrode MG and the height of the element isolation part ST below the control gate electrode CG are different from each other. The height of the element isolation part ST below the memory gate electrode MG is higher than the height of the element isolation part ST below the control gate electrode CG. In other words, the surface (TOP) of the element isolation part ST below the control gate electrode CG is lower (depressed) than the surface of the element isolation part ST below the memory gate electrode MG. To put it still another way, the surface (TOP) of each fin of the memory gate electrode MG and the surface of each fin below the control gate electrode CG are at substantially the same level. When a difference in height between the surface of a fin and the surface of the element isolation part ST is taken as fin height, the fin height FH1 below the memory gate electrode MG is smaller than the fin height FH2 below the control gate electrode CG.

A mismatch between electron injection and hole injection is improved, rewriting operation speed is accelerated, and reliability is enhanced by making the height of the element isolation part ST below the memory gate electrode MG higher than the height of the element isolation part ST below the control gate electrode CG as mentioned above.

Figure 4:
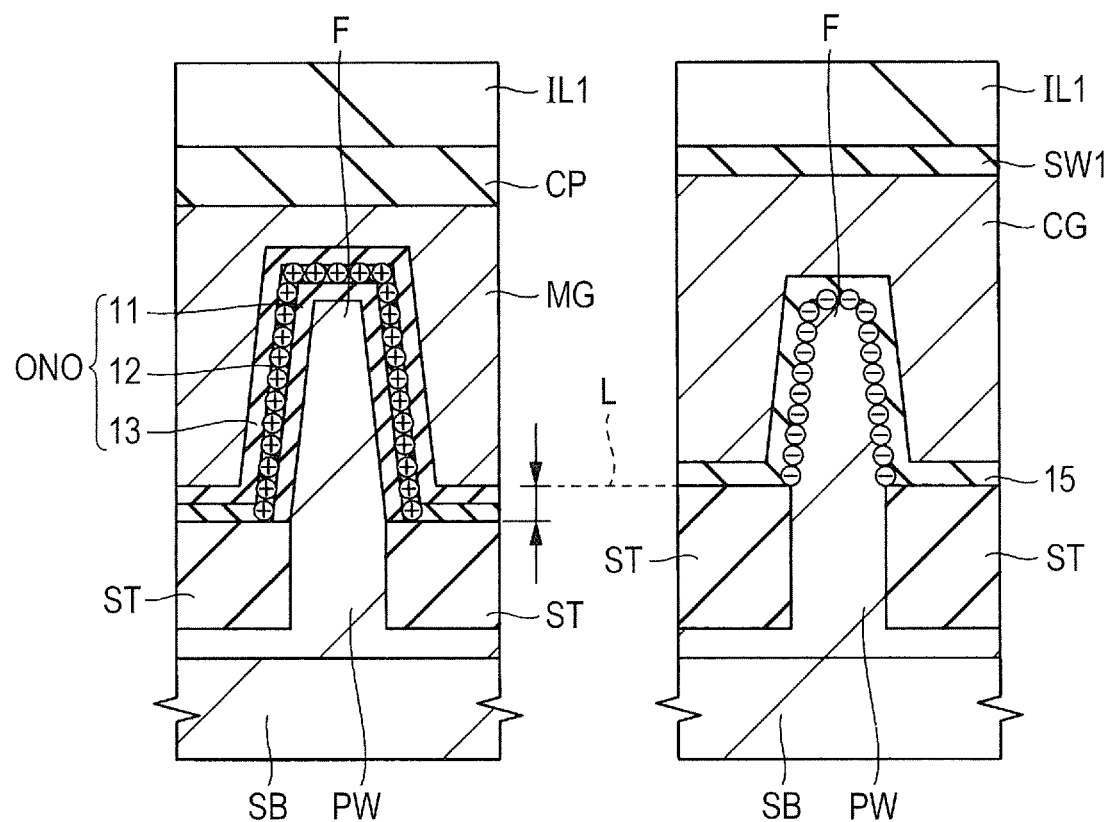
FIG. 4 is a drawing illustrating a semiconductor device in a comparative example.
Figure 5:
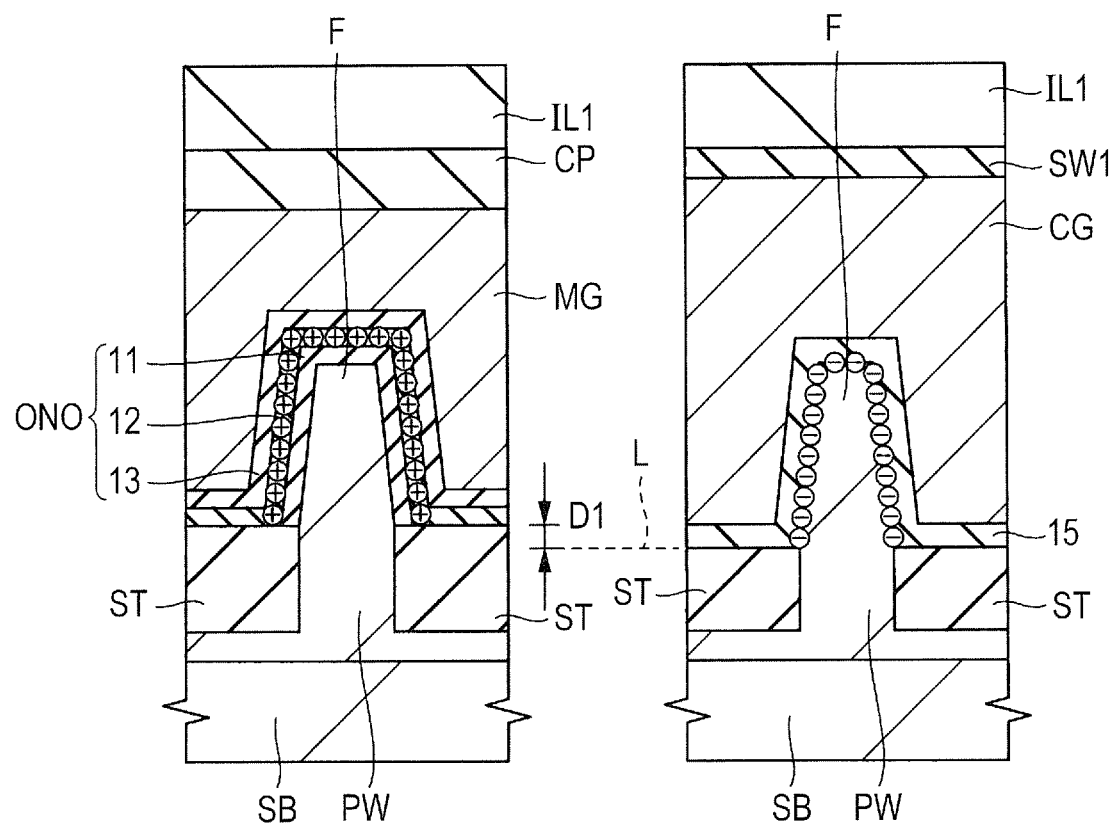
FIG. 5 is a drawing illustrating a semiconductor device in the first embodiment.

FIG. 4 illustrates a semiconductor device in a comparative example in which the height of the element isolation part ST below the memory gate electrode MG is lower than the height of the element isolation part ST below the control gate electrode CG. FIG. 5 illustrates a semiconductor device in this embodiment in which the height of the element isolation part ST below the memory gate electrode MG is higher than the height of the element isolation part ST below the control gate electrode CG.

In the above-mentioned SSI writing scheme, when electrons go from a channel below the control gate electrode CG to a channel below the memory gate electrode MG, the electrons are accelerated by an electric field. As a result, the electrons are turned into hot electrons and injected into the silicon nitride film (12). For this reason, in the semiconductor device in the comparative example shown in FIG. 4, electron injection efficiently occurs above line L of FIG. 4 where a channel below the control gate electrode CG and a channel below the memory gate electrode MG overlap with each other.

Meanwhile, in the above-mentioned BTBT erasing scheme, holes produced by a strong electric field on the source region MS side of the memory gate electrode MG are injected into the silicon nitride film (12). For this reason, hole injection occurs throughout the channels of the memory gate electrode MG.

When the height of the element isolation part ST below the memory gate electrode MG is lower than the height of the element isolation part ST below the control gate electrode CG (in the case of FIG. 4), electron injection occurs only in the upper parts of the fins F and hole injection occurs in the entire fins F. For this reason, a mismatch takes place between writing and erasing. A more specific description will be given, of holes injected from the entire fins F into the silicon nitride film (12), holes in the lower parts of the fins F are not canceled out by electrons injected from a channel below the control gate electrode CG and sufficient erasing is not performed. Therefore, the threshold voltage of the memory transistor cannot be lowered to a desired value. Further, since holes in the lower parts of the fins F cannot be efficiently canceled out by electron injection, erasing (rewriting) requires some time. Because of a mismatch between electron injection and hole injection, as mentioned above, there is a possibility that rewriting operation speed is decelerated and reliability is degraded.

Meanwhile, when the height of the element isolation part ST below the memory gate electrode MG is higher than the height of the element isolation part ST below the control gate electrode CG as in this embodiment (FIG. 5), the area where holes are injected is limited to above line L of the fins F and electrons are injected into the entire fins F. For this reason, holes above line L of the fins F are canceled out by electrons injected from a channel below the control gate electrode CG and sufficient erasing can be performed. Further, since there is not the silicon nitride film (12) as a charge storage part in positions corresponding to electrons in the lower parts of the fins F, electrons injected from a channel below the control gate electrode CG are less prone to be stored in the silicon nitride film (12). According to this embodiment, as mentioned above, a mismatch between writing and erasing is improved, rewriting operation speed is accelerated, and reliability is enhanced.

(Explanation of Manufacturing Process)

Hereafter, a description will be given to a manufacturing method for a semiconductor device in this embodiment with reference to FIG. 6 to FIG. 31. FIG. 6 to FIG. 31 are sectional views or perspective views of a semiconductor device in this embodiment in the course of a formation process.

<Step of Forming Fin>

Figure 6:
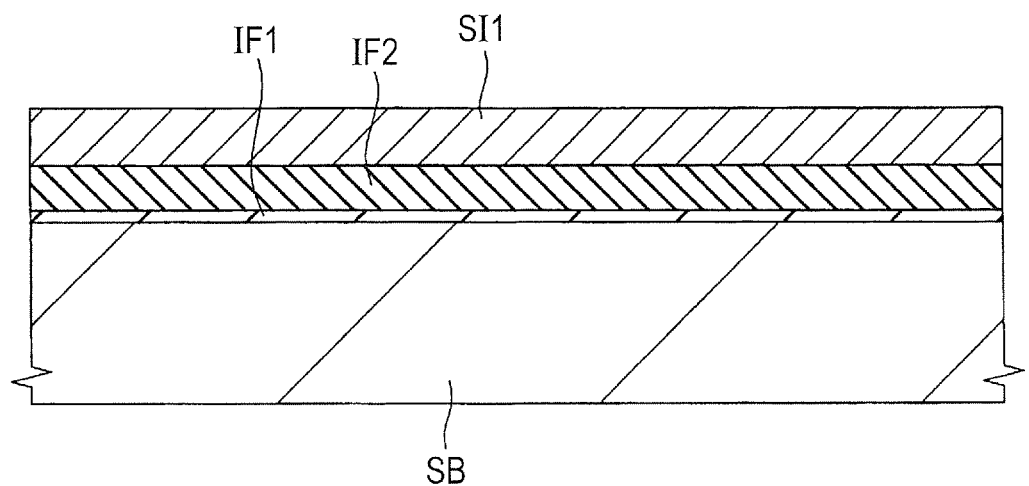
FIG. 6 is a sectional view of a semiconductor device in the first embodiment in the course of a formation process.

A description will be given to a step of forming fins F with reference to FIG. 6 to FIG. 17. First, a semiconductor substrate SB is provided as shown in FIG. 6 and an insulating film IF1, an insulating film IF2, and a semiconductor film SI1 are formed over a main surface of the semiconductor substrate SB in this order. The semiconductor substrate SB is formed of, for example, p-type single crystal silicon having a specific resistance of approximately 1 to 10 Ωcm. The insulating film IF1 is formed of, for example, a silicon oxide film and can be formed using thermal oxidation or CVD (Chemical Vapor Deposition). The film thickness of the insulating film IF1 is approximately 2 to 10 nm. The insulating film IF2 is formed of, for example, a silicon nitride film and the film thickness thereof is approximately 20 to 100 nm. The insulating film IF2 can be formed by, for example, CVD. The semiconductor film SI1 is formed of, for example, a silicon film and is formed by, for example, CVD. The film thickness of the semiconductor film SI1 is, for example, 20 to 200 nm.

Figure 7:
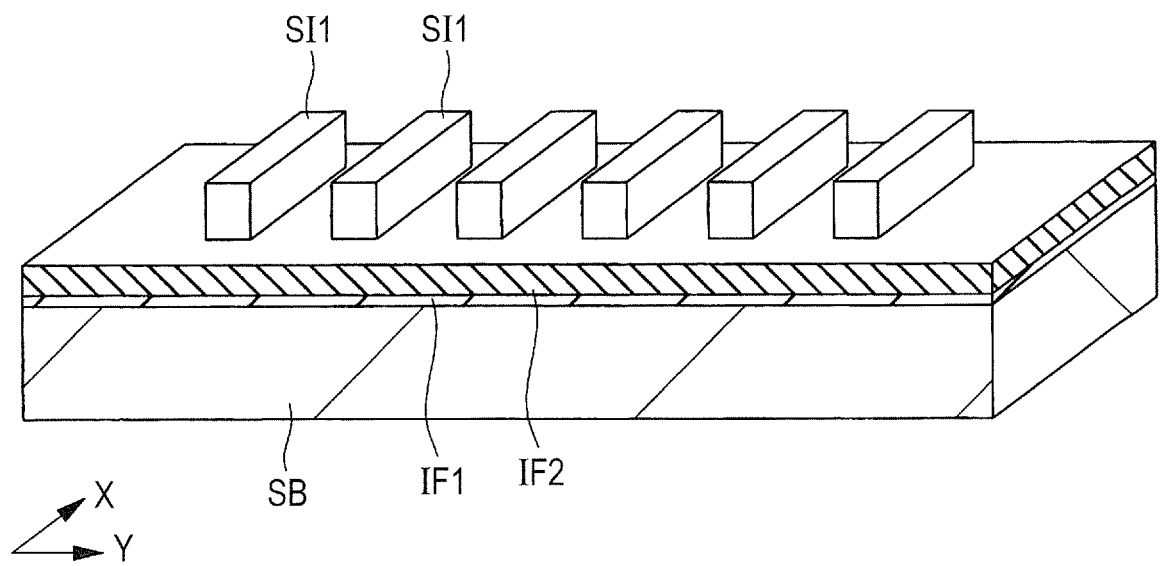
FIG. 7 is a perspective view of a semiconductor device in the first embodiment in the course of a formation process.
Figure 8:
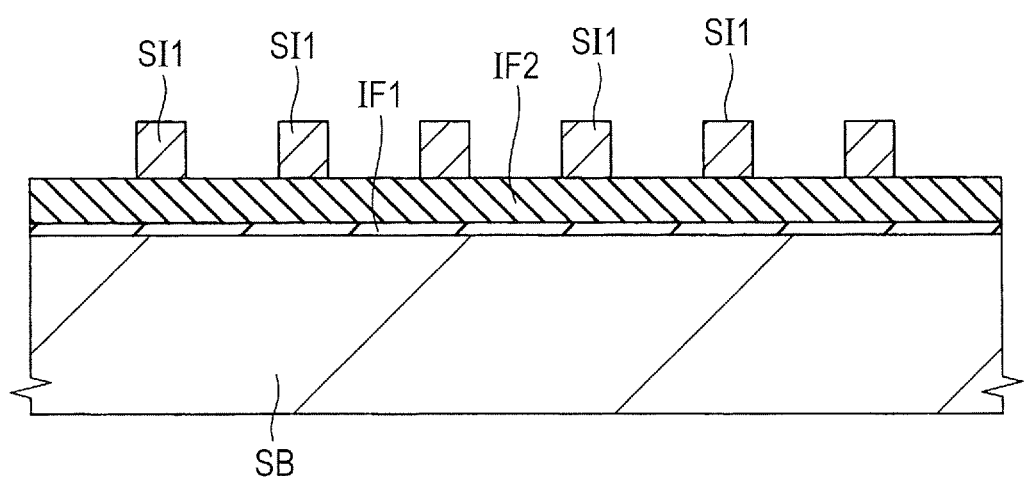
FIG. 8 is a sectional view of a semiconductor device in the first embodiment in the course of a formation process.

Subsequently, the semiconductor film SI1 is processed using photolithography and etching as shown in FIG. 7 and FIG. 8. As a result, multiple quadrangular prism-shaped (rectangular parallelepiped-shaped) semiconductor films SI1 extending in the X-direction are formed over the insulating film IF2 in line with one another in the Y-direction.

Figure 9:
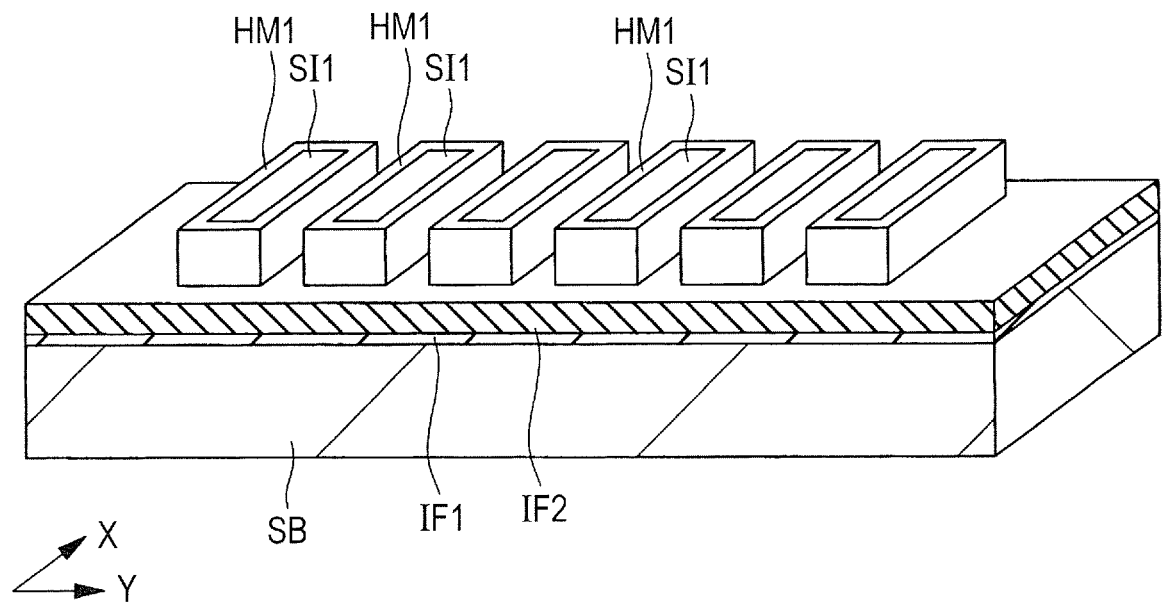
FIG. 9 is a perspective view of a semiconductor device in the first embodiment in the course of a formation process.
Figure 10:
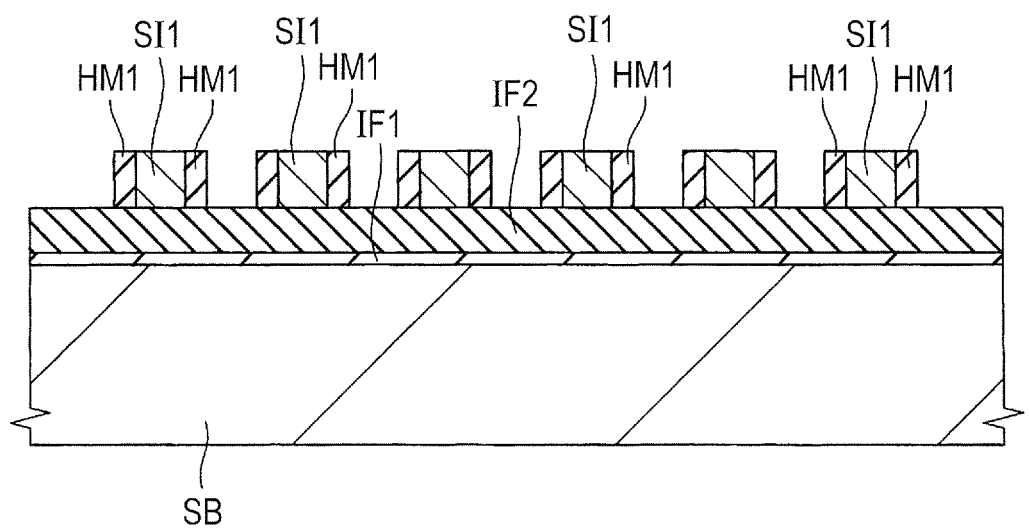
FIG. 10 is a sectional view of a semiconductor device in the first embodiment in the course of a formation process.

Subsequently, a hard mask HM1 covering side walls of each of the semiconductor films SI1 is formed as shown in FIG. 9 and FIG. 10. Here, for example, a silicon oxide film having a film thickness of 10 to 40 nm is formed over the semiconductor substrate SB using CVD and then anisotropic dry etching is performed. As a result, the respective upper faces of the insulating film IF2 and the semiconductor films SI1 are exposed to form the hard masks HM1 comprised of a silicon oxide film remaining on the side walls of the semiconductor films SI1. The hard masks HM1 do not completely bury the areas between adjoining semiconductor films SI1. As described later, the hard masks HM1 play a role as masks used to form fins directly thereunder.

Figure 11:
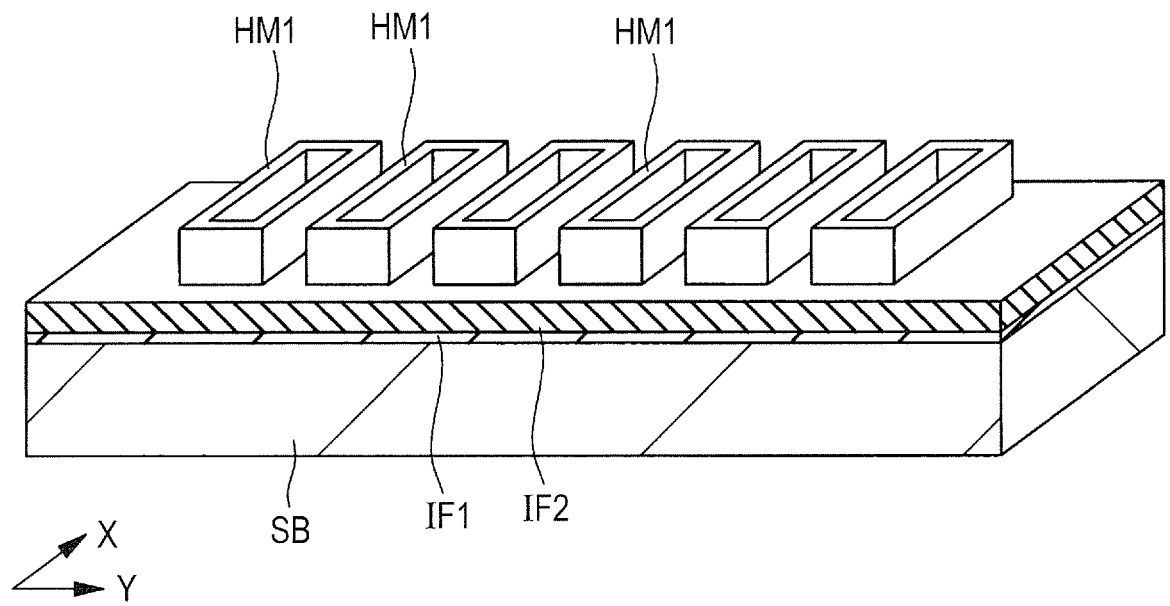
FIG. 11 is a perspective view of a semiconductor device in the first embodiment in the course of a formation process.
Figure 12:
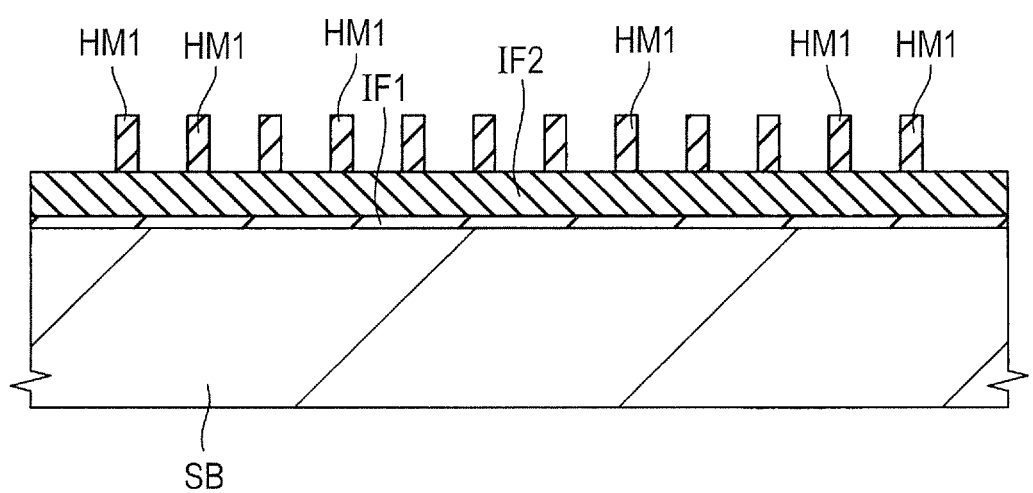
FIG. 12 is a sectional view of a semiconductor device in the first embodiment in the course of a formation process.

Subsequently, the semiconductor films SI1 are removed using wet etching as shown in FIG. 11 and FIG. 12. As a result, annular hard masks HM1 substantially in a rectangular shape as viewed in a plane can be formed. More specifically, each hard mask HM1 includes: a first portion extending in the X-direction; a second portion coupled with the first portion and extending in the Y-direction; a third portion coupled with the second portion and extending in the X-direction; and a fourth portion coupled with the third portion and extending in the Y-direction. The fourth portion is coupled with the first portion. Thereafter, wet etching may be performed to partly remove the surface of each hard mask HM1. This makes it possible to reduce the width (for example, length in the Y-direction) of each hard mask HM1.

Figure 13:
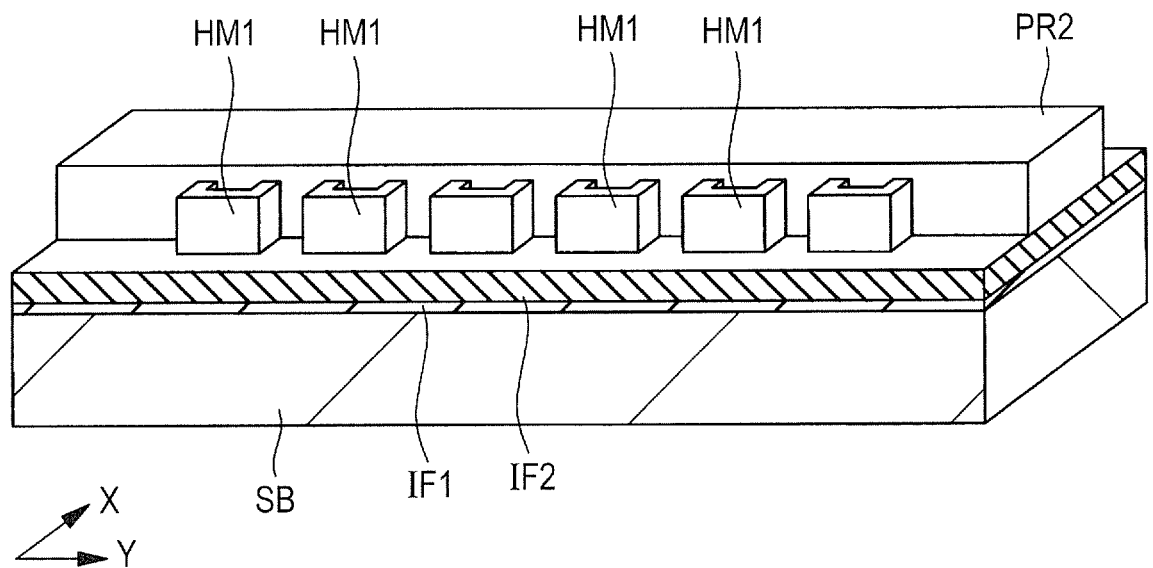
FIG. 13 is a perspective view of a semiconductor device in the first embodiment in the course of a formation process.

Subsequently, as shown in FIG. 13, a photoresist film PR2 is formed which covers a portion of each hard mask HM1 extending in the X-direction and exposes a portion of each hard mask extending in the Y-direction.

Figure 14:
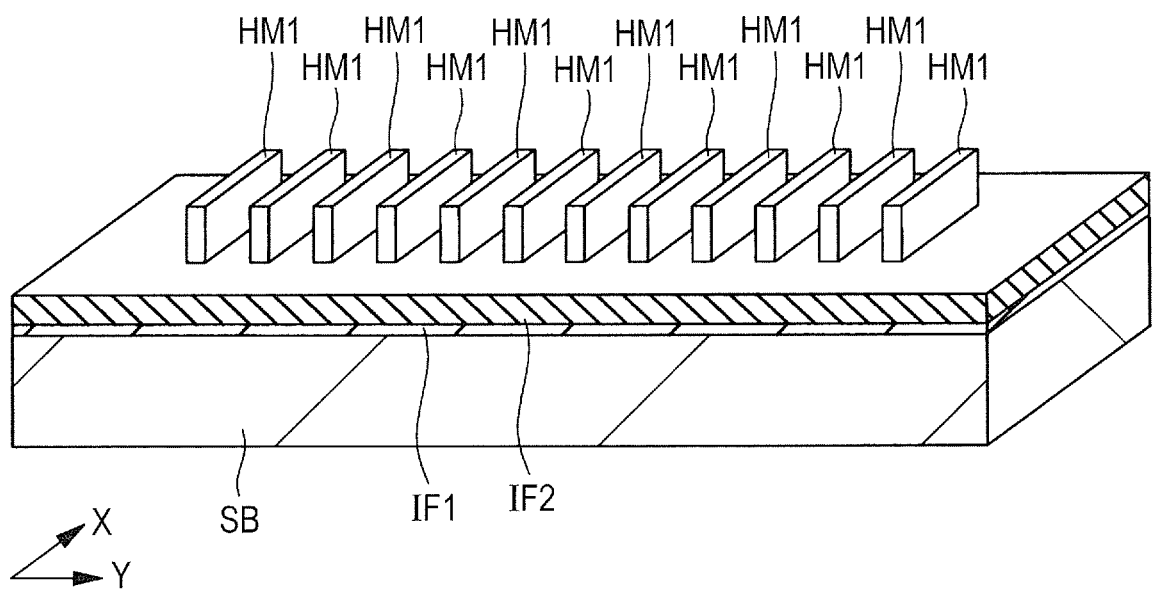
FIG. 14 is a perspective view of a semiconductor device in the first embodiment in the course of a formation process.
Figure 15:
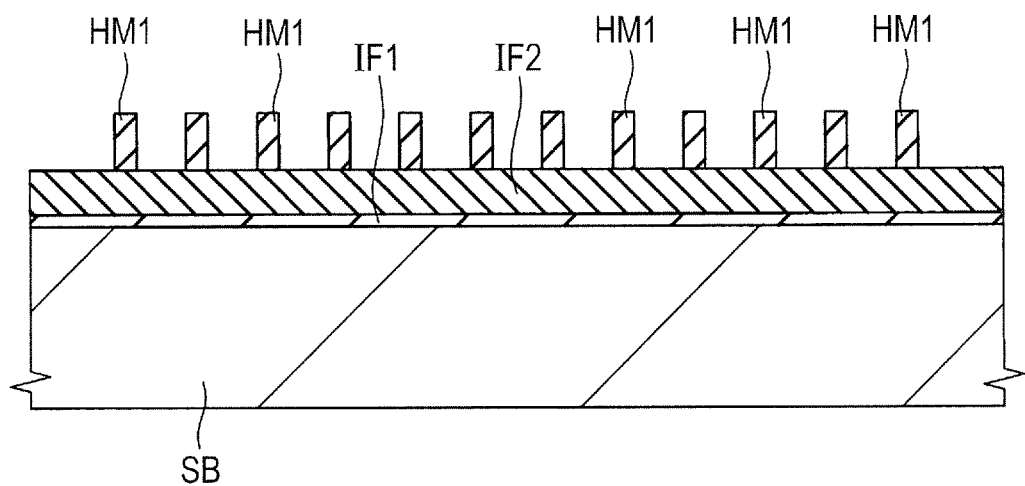
FIG. 15 is a sectional view of a semiconductor device in the first embodiment in the course of a formation process.

Subsequently, as shown in FIG. 14 and FIG. 15, etching is performed using the photoresist film PR2 as a mask to remove a portion of each hard mask HM1 extending in the Y-direction and thereafter the photoresist film PR2 is removed. As a result, only a portion of each hard mask HM1 extending in the X-direction remains. That is, multiple quadrangular prism-shaped hard masks HM1 extending in the X-direction are disposed over the insulating film IF2 in line with one another in the Y-direction.

Figure 16:
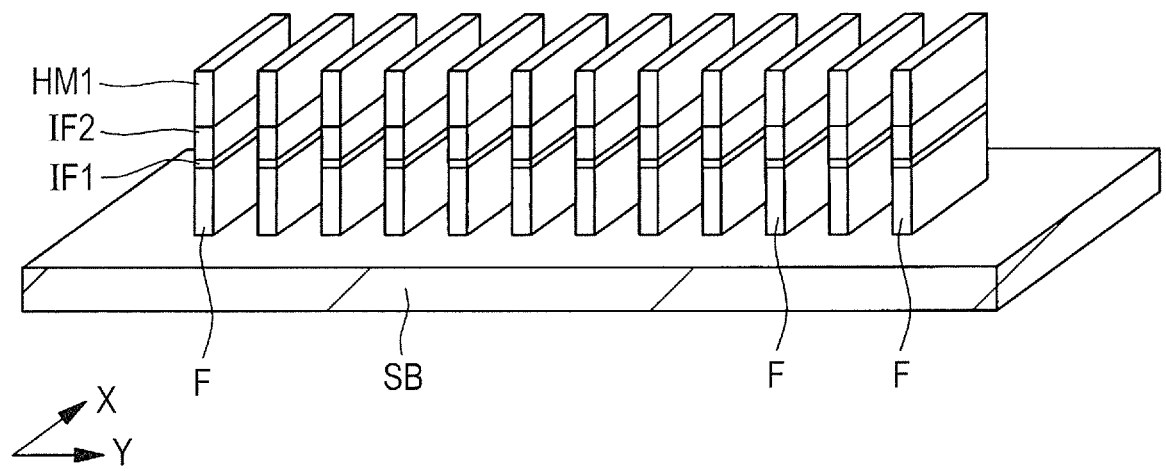
FIG. 16 is a perspective view of a semiconductor device in the first embodiment in the course of a formation process.
Figure 17:
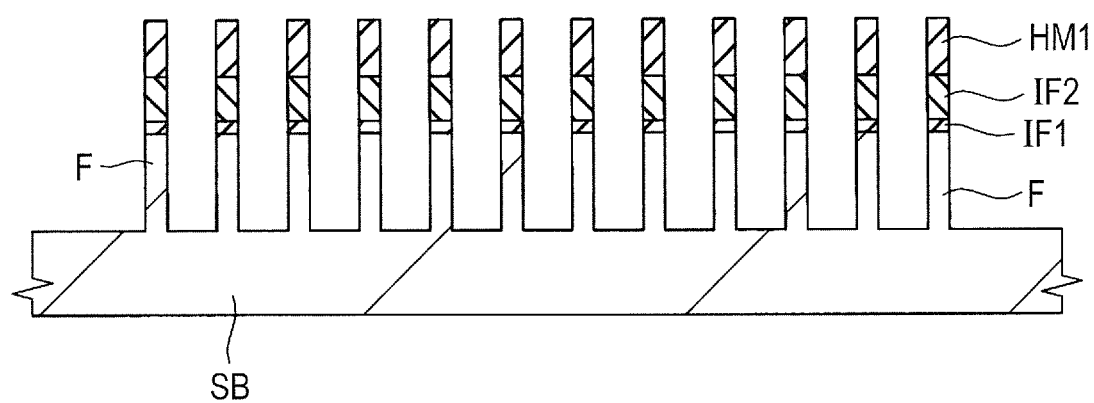
FIG. 17 is a sectional view of a semiconductor device in the first embodiment in the course of a formation process.

Subsequently, as shown in FIG. 16 and FIG. 17, anisotropic dry etching is performed on the insulating films IF2, IF1 and the semiconductor substrate SB using the hard masks HM1 as a mask. This makes it possible to form fins F processed into a quadrangular prism shape directly under the hard masks HM1. Here, by sinking the main surface of the semiconductor substrate SB in the areas exposed from the hard masks HM1 by 100 to 250 nm, isolation trenches can be formed and fins F having a height of 100 to 250 nm from the main surface of the semiconductor substrate SB can be formed.

<Steps Following Step of Forming Element Isolation Part>

Figure 18:
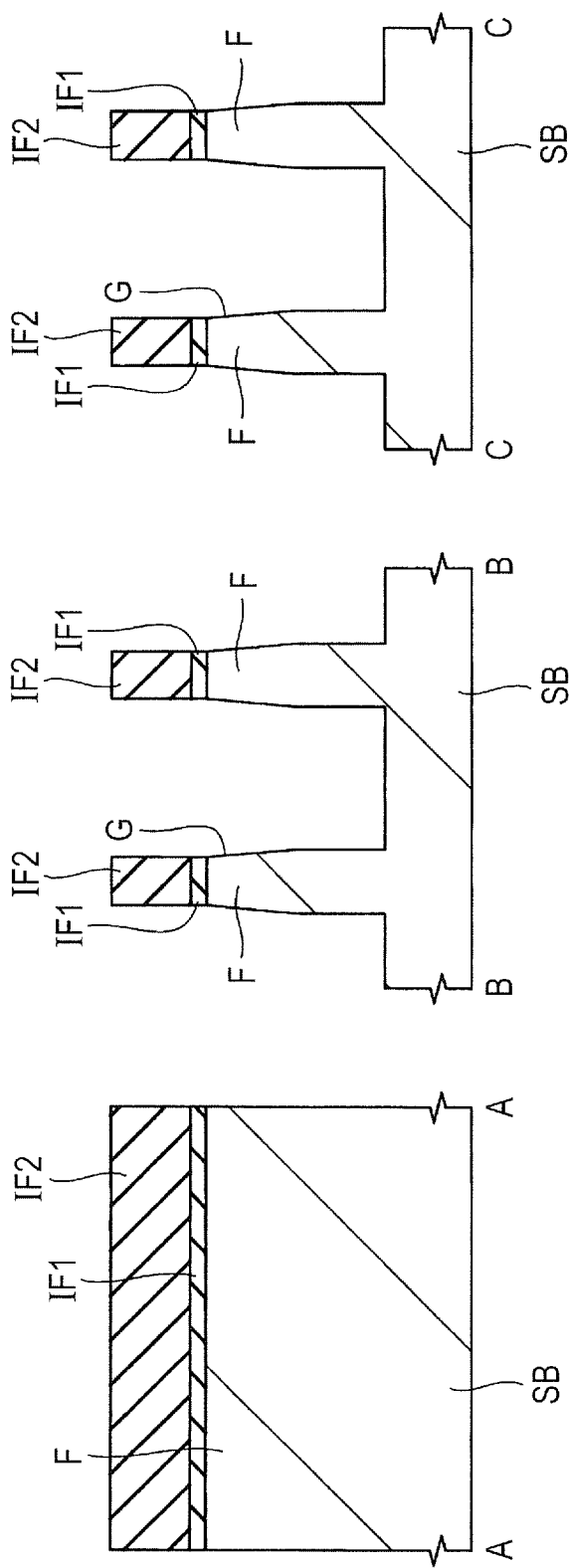
FIG. 18 is a sectional view of a semiconductor device in the first embodiment in the course of a formation process.
Figure 19:
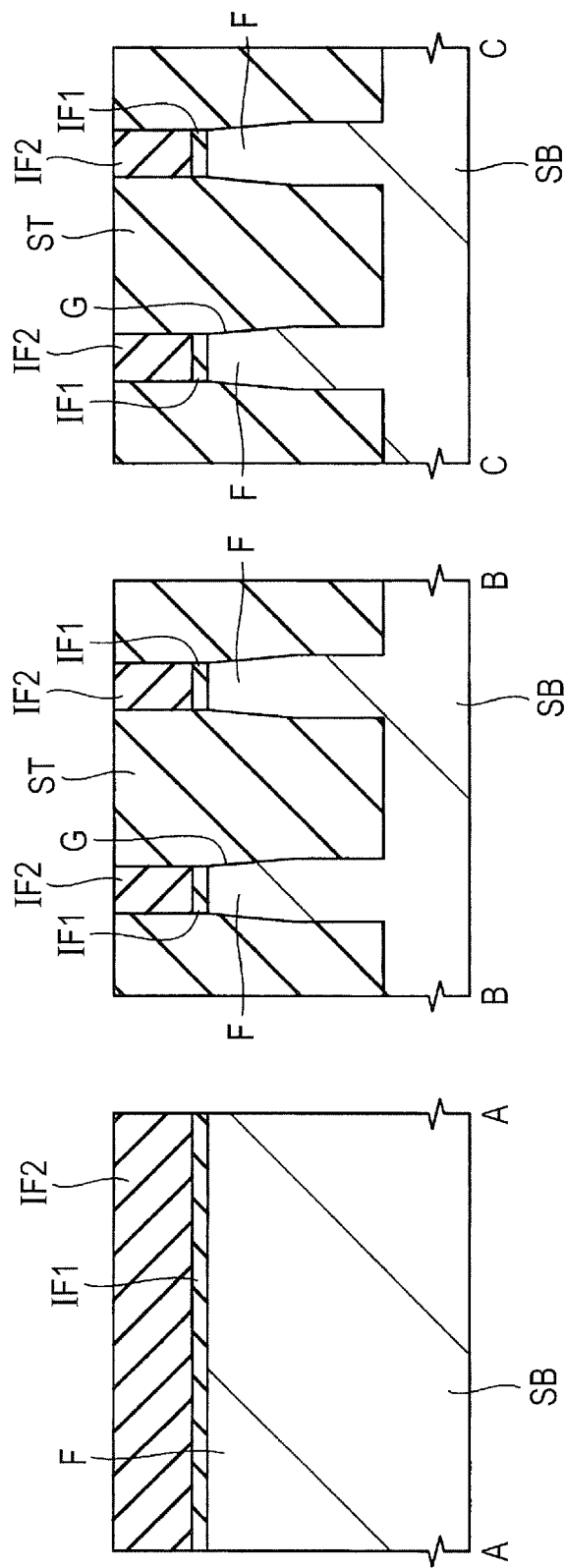
FIG. 19 is a sectional view of a semiconductor device in the first embodiment in the course of a formation process.

A description will be given to steps following the step of forming the element isolation parts ST with reference to FIG. 18 to FIG. 31. FIG. 18 illustrates the insulating films IF1 and IF2 remain over the fins F as the result of the hard masks HM1 shown in FIG. 17 being removed by etching or the like. Side faces of each fin F may be tapered as shown in FIG. 18. An insulating film formed of a silicon oxide film or the like is deposited over the semiconductor substrate SB shown in FIG. 18 such that the grooves G (isolation trenches) between the fins, the fins F, and the insulating films IF1 and IF2 are completely buried as shown in FIG. 19. Subsequently, this insulating film is polished by CMP (Chemical Mechanical Polishing) to expose the upper faces of the insulating films IF2. Also in cases where the hard masks HM1 shown in FIG. 17 are not removed, the hard masks HM1 are eliminated by polishing.

Figure 20:
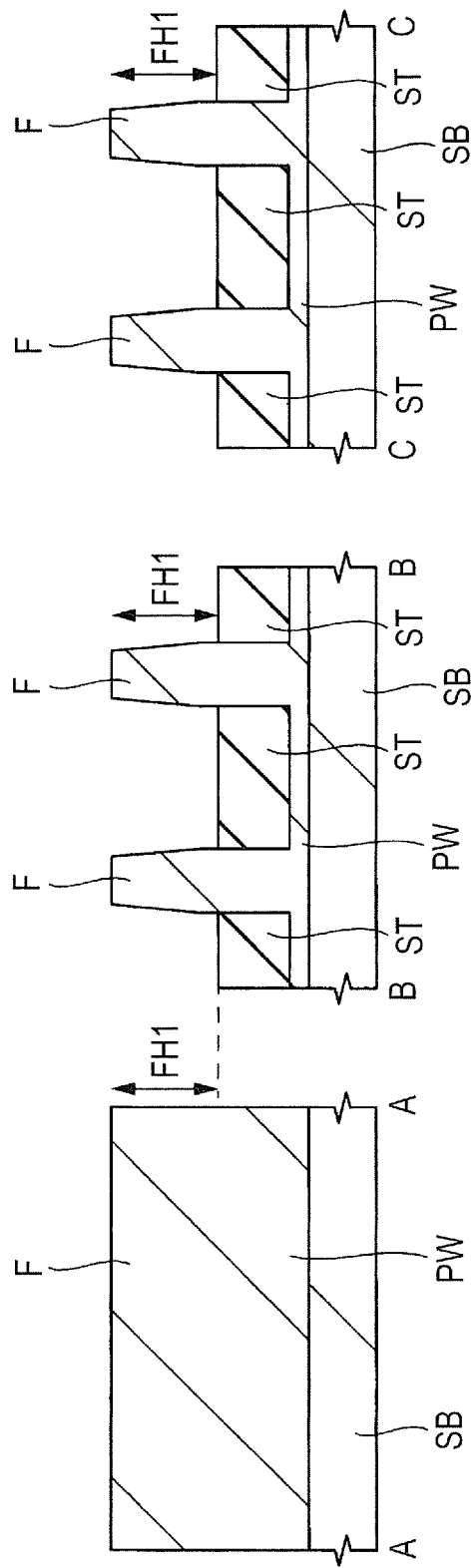
FIG. 20 is a sectional view of a semiconductor device in the first embodiment in the course of a formation process.

Subsequently, the insulating films IF1 and IF2 are removed as shown in FIG. 20. Subsequently, impurities are introduced into a main surface of the semiconductor substrate SB using ion implantation to form a p-type well PW. The p-type well PW is formed by implanting p-type impurities (for example, B (boron)). The p-type well PW is formed in the whole of each fin F and part of the semiconductor substrate SB below each fin F. N-type impurities may be ion-implanted into an area not shown in the drawing to form an n-type well. Subsequently, the upper faces of the insulating films between the fins F are subjected to etching to depress (lower) the upper faces of the element isolation parts ST. As a result, part of side faces and the upper face of each fin F are exposed. At this time, the height of each fin F is FH1. The height of each fin F is equivalent to a difference in height between the upper face of the fin F and each element isolation part ST. The height FH1 of each fin F is, for example, approximately 30 to 80 nm.

Figure 21:
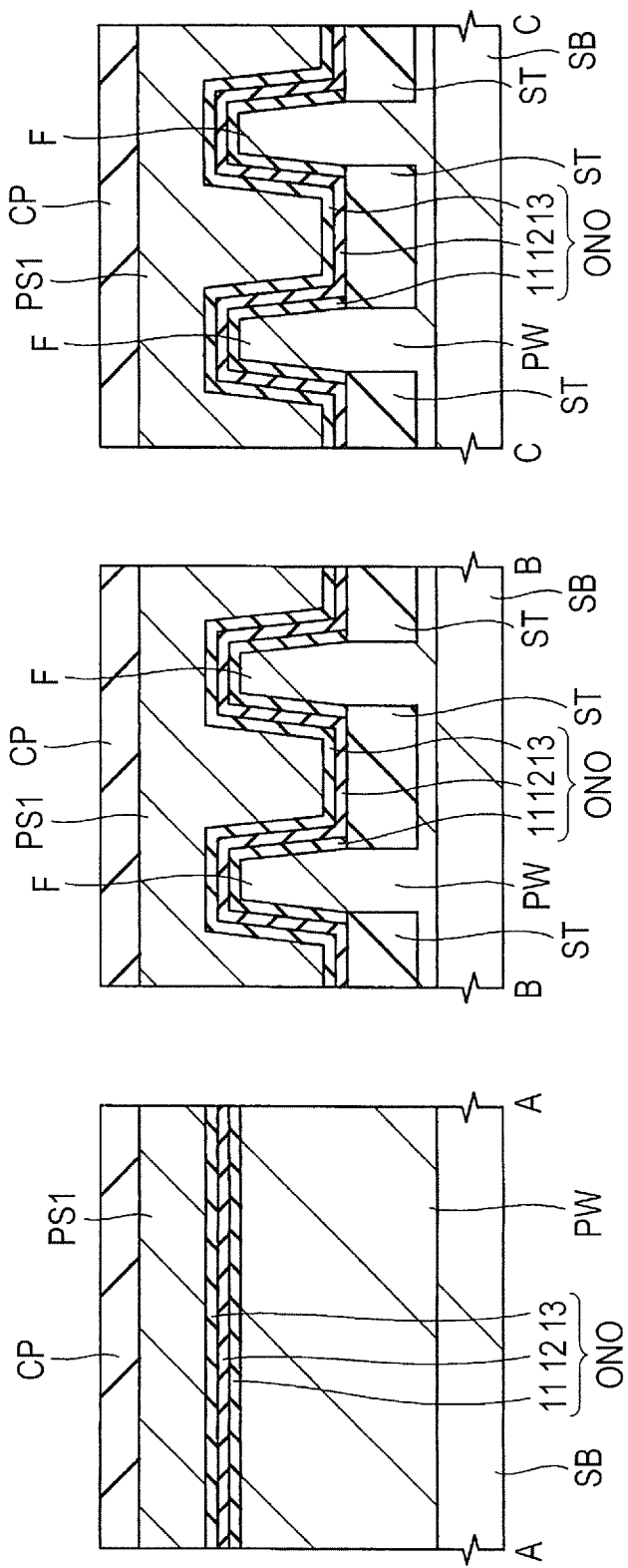
FIG. 21 is a sectional view of a semiconductor device in the first embodiment in the course of a formation process.

Subsequently, the insulating film ONO (11, 12, 13) is formed as shown in FIG. 21. First, for example, a silicon oxide film is formed as the lower layer insulating film 11 over the fins F and the element isolation parts ST. This silicon oxide film is formed with a film thickness of approximately 4 nm by, for example, thermal oxidation. The silicon oxide film may be formed using CVD or the like. Subsequently, for example, a silicon nitride film is deposited with a film thickness of approximately 7 nm as the intermediate layer insulating film 12 over the lower layer insulating film 11 by CVD or the like. This intermediate layer insulating film 12 serves as a charge storage part of the memory cell. Subsequently, for example, a silicon oxide film is deposited with a film thickness of approximately 9 nm as the upper layer insulating film 13 over the intermediate layer insulating film 12 by CVD or the like.

Subsequently, a conductive film to be the memory gate electrode MG is formed over the insulating film ONO (11, 12, 13). For example, a polysilicon film PS1 of approximately 40 nm to 150 nm is deposited as a conductive film over the insulating film ONO (11, 12, 13) using CVD or the like. Subsequently, polishing is performed by CMP to planarize the upper face of the polysilicon film PS1. The difference in height between the upper face of the planarized polysilicon film PS1 and the upper face of each fin F is approximately 40 nm to 60 nm. Subsequently, a cap insulating film CP is formed over the polysilicon film PS1. For example, a silicon nitride film of approximately 80 nm is formed over the polysilicon film PS1 using CVD or the like.

Figure 22:
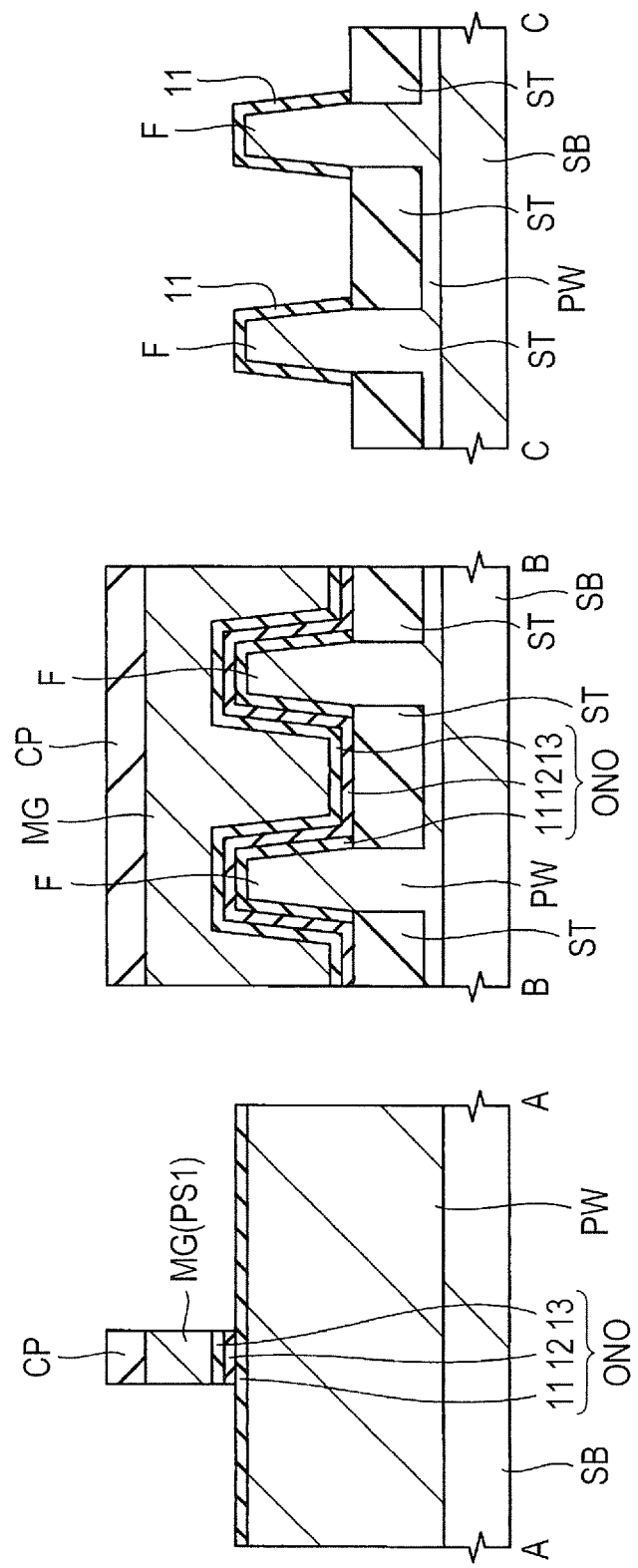
FIG. 22 is a sectional view of a semiconductor device in the first embodiment in the course of a formation process.

Subsequently, the laminated film of the insulating film ONO (11, 12, 13) and the polysilicon film PS1 are patterned using photolithography and dry etching to form the memory gate electrode MG as shown in FIG. 22. In this example, of the insulating film ONO, the lower layer insulating film (silicon oxide film) 11 is caused to function as an etching stopper film and left laminarly during etching. For this reason, the lower layer insulating film (silicon oxide film) 11 remains on the surface of each fin F in the C-C section (control gate electrode CG formation region).

Figure 23:
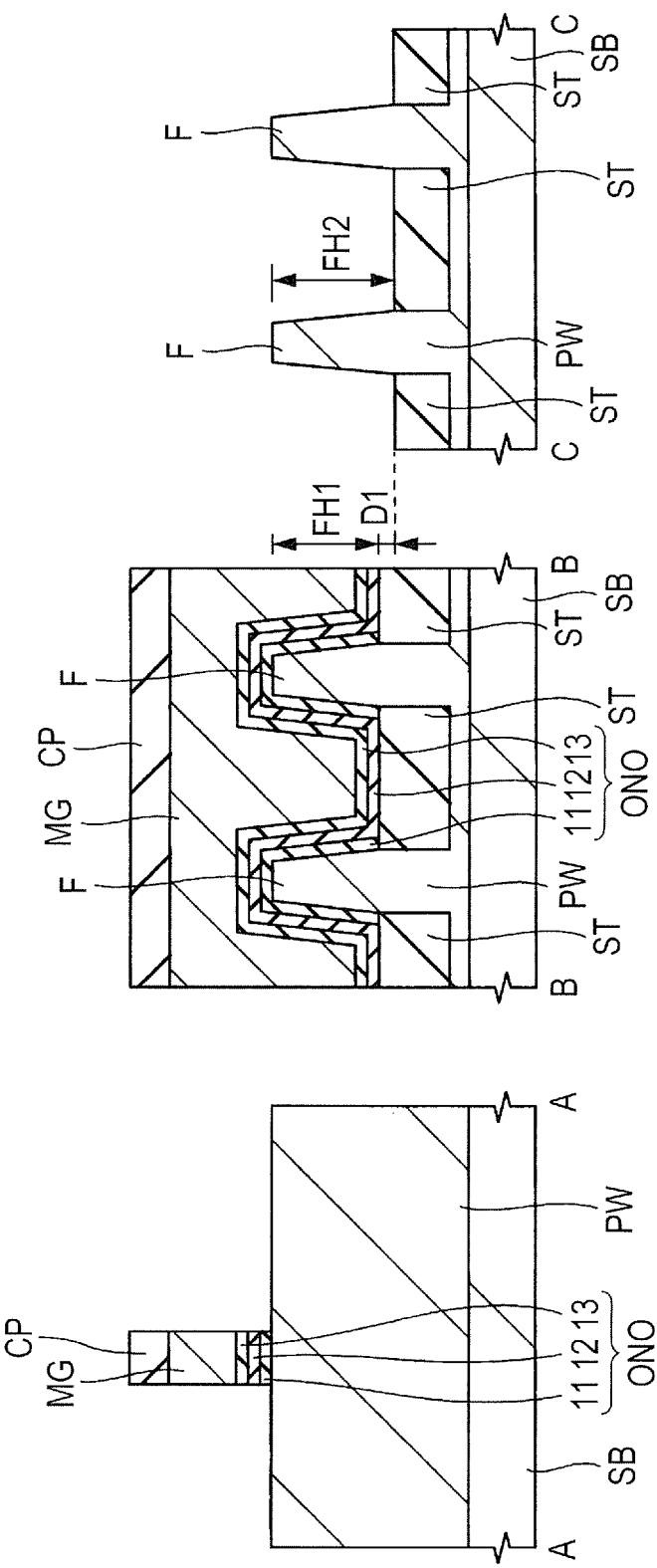
FIG. 23 is a sectional view of a semiconductor device in the first embodiment in the course of a formation process.

Subsequently, the lower layer insulating film (silicon oxide film) 11 remaining on the surface of each fin F in the C-C section (control gate electrode CG formation region) is removed by etching as shown in FIG. 23. For this etching, dry etching or wet etching can be used. During this etching of the lower layer insulating film (silicon oxide film) 11, the upper faces of the element isolation parts ST between fins are depressed. Especially, when the lower layer insulating film (silicon oxide film) 11 is a dense thermal oxidation film and the element isolation parts (silicon oxide films) ST is comprised of a CVD film, the upper face of each element isolation part ST is depressed by an amount not less than the film thickness of the lower layer insulating film (silicon oxide film) 11. When the lower layer insulating film (silicon oxide film) 11 is etched, overetching is performed. This overetching is, for example, for an etching time equivalent to a film thickness of 30% of the film thickness of the lower layer insulating film (silicon oxide film) 11. The upper face of each element isolation part ST is depressed also by this overetching.

As mentioned above, the lower layer insulating film (silicon oxide film) 11 remaining on the surface of each fin F is etched in the C-C section (control gate electrode CG formation region). As a result, the upper face of each element isolation part ST in the C-C section (control gate electrode CG formation region) is lower than the upper face of each element isolation part ST in the B-B section (memory gate electrode MG formation region). These differences in height are D1; the height of each fin F in the memory gate electrode MG formation region is FH1; and the height of each fin F in the control gate electrode CG formation region is FH2 (FH2>FH1). When the height FH1 is located in the height FH2, the above-mentioned mismatch between electron injection and hole injection is improved.

Here, it is desirable that the above-mentioned difference in height D1 should be not less than 5 nm and not more than 10 nm. When the difference in height D1 is not less than 5 nm, the effect of improving the above-mentioned mismatch between writing and erasing can be sufficiently ensured. If overetching is performed in which the above-mentioned difference in height D1 exceeds 10 nm, side etching could occur in the insulating film ONO (11, 12, 13) located below the memory gate electrode MG. Especially, in wet etching, side etching is prone to occur. For this reason, it is desirable that the above-mentioned difference in height D1 should be not more than 10 nm.

Figure 24:
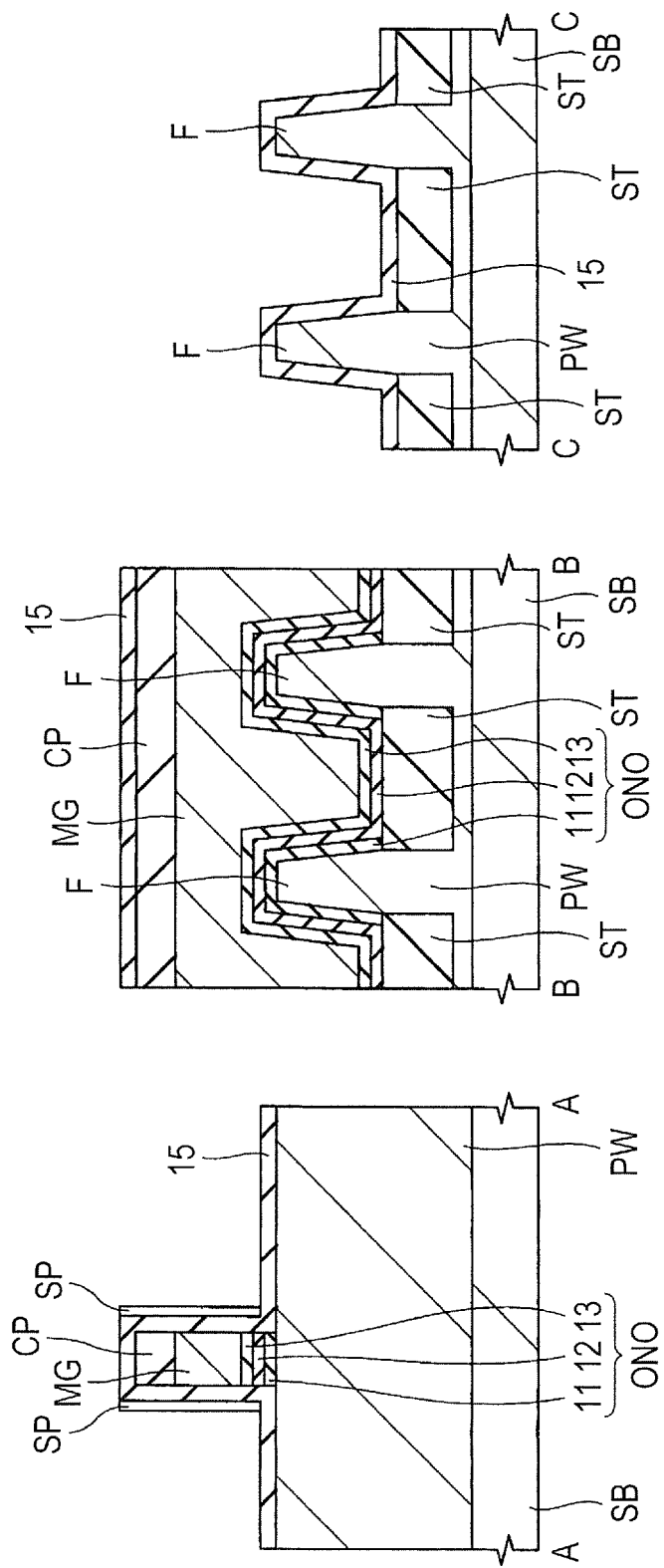
FIG. 24 is a sectional view of a semiconductor device in the first embodiment in the course of a formation process.

Subsequently, the insulating film 15 is formed over the semiconductor substrate SB as shown in FIG. 24. This insulating film 15 serves as a control gate insulating film CGI. For example, a silicon oxide film of approximately 4 nm is formed as the insulating film 15 over the semiconductor substrate SB by CVD or the like. Subsequently, an insulating film for spacer SP formation (for example, a silicon nitride film or the like of approximately 4 nm) is formed over the insulating film 15 by CVD or the like and this insulating film for spacer SP formation is then etched back by anisotropic dry etching. As a result, a spacer (side wall insulating film) SP is formed over side walls of the memory gate electrode MG with the insulating film 15 in between. This formation of the spacer SP may be omitted.

Figure 25:
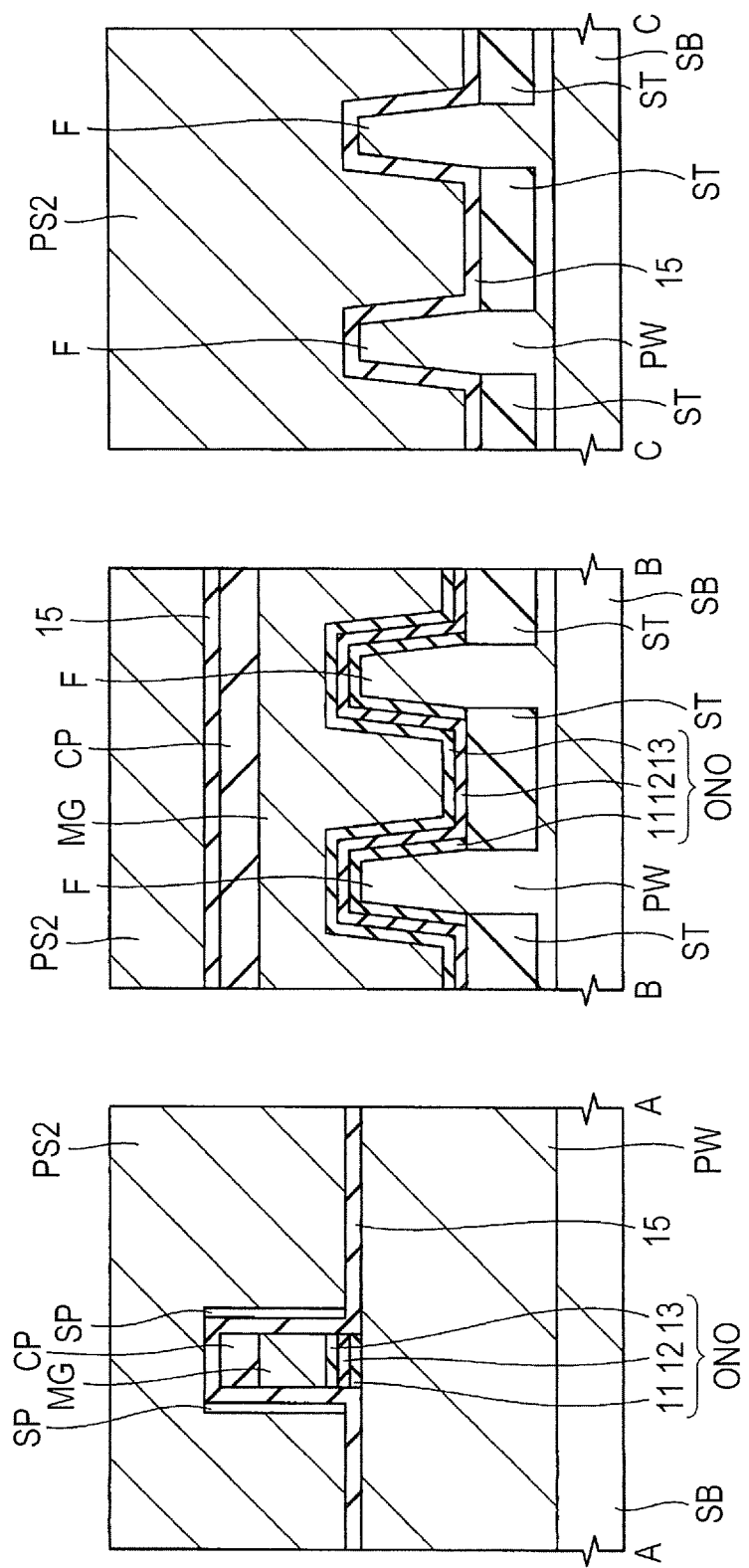
FIG. 25 is a sectional view of a semiconductor device in the first embodiment in the course of a formation process.

Subsequently, a polysilicon film (conductive film) PS2 for the control gate electrode CG is formed over the insulating film 15 and the spacer SP as shown in FIG. 25. For example, the polysilicon film PS2 of approximately 150 nm to 300 nm is formed over the insulating film 15 using CVD or the like. Subsequently, polishing is performed by CMP to planarize the upper face of the polysilicon film PS2.

Figure 26:
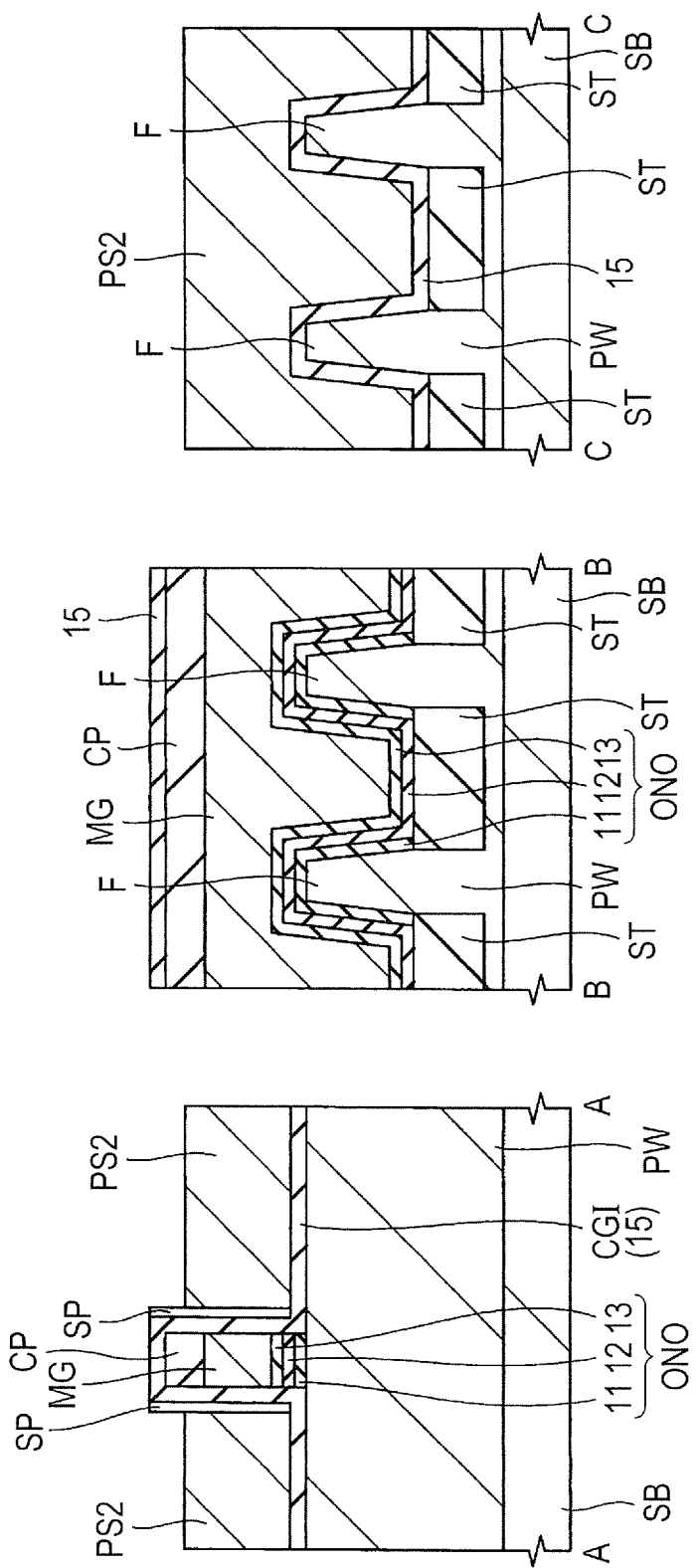
FIG. 26 is a sectional view of a semiconductor device in the first embodiment in the course of a formation process.

Subsequently, the upper face of the polysilicon film PS2 is etched to depress (lower) the upper face of the polysilicon film PS2 as shown in FIG. 26. As a result, the insulating film 15 and the upper part of the spacer SP are exposed over the upper face of the memory gate electrode MG. The upper face of the remaining polysilicon film PS2 is located in a position higher than the upper face of the memory gate electrode MG and lower than the upper face of the cap insulating film CP. There is a difference in height between the upper face of the insulating film 15 and the upper face of the polysilicon film PS2 and the spacer SP is exposed there.

Figure 27:
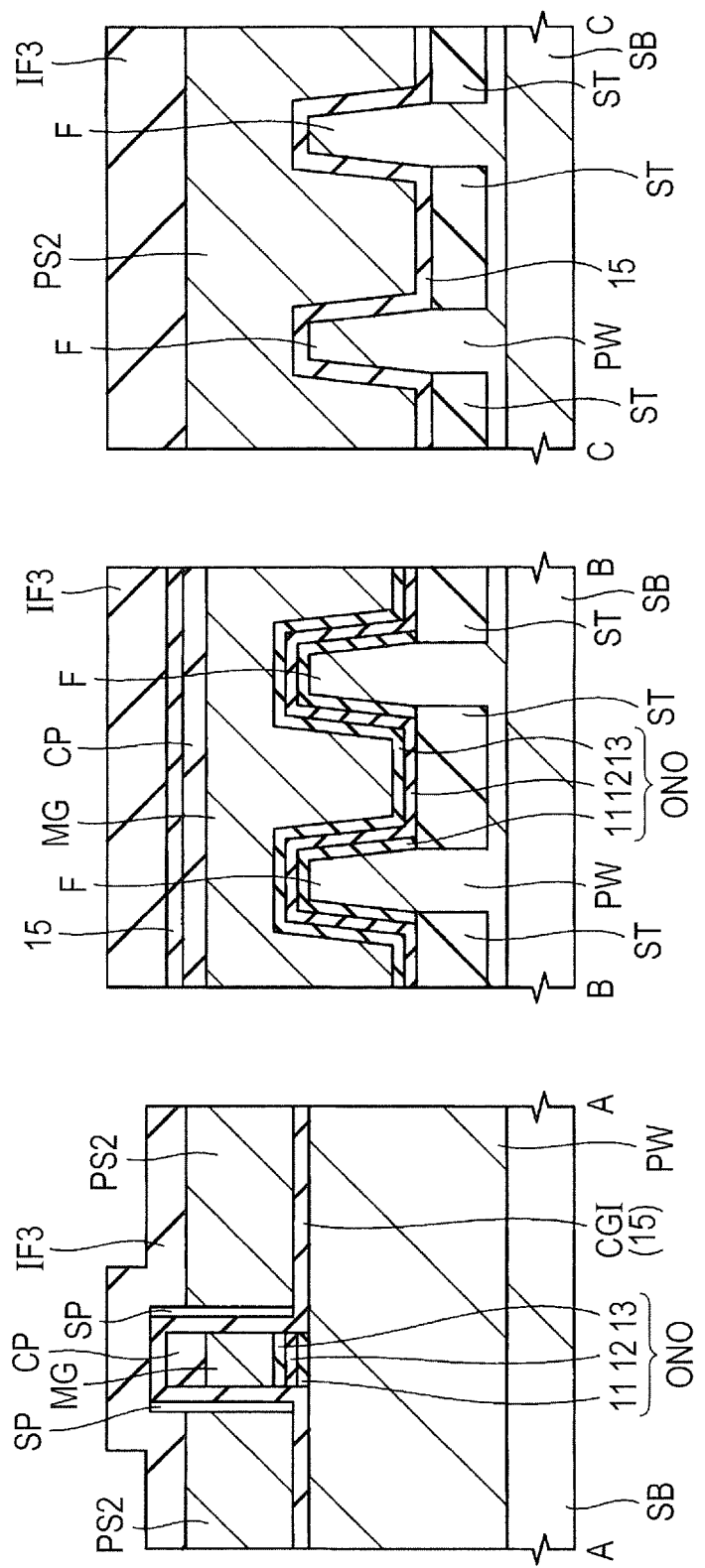
FIG. 27 is a sectional view of a semiconductor device in the first embodiment in the course of a formation process.
Figure 28:
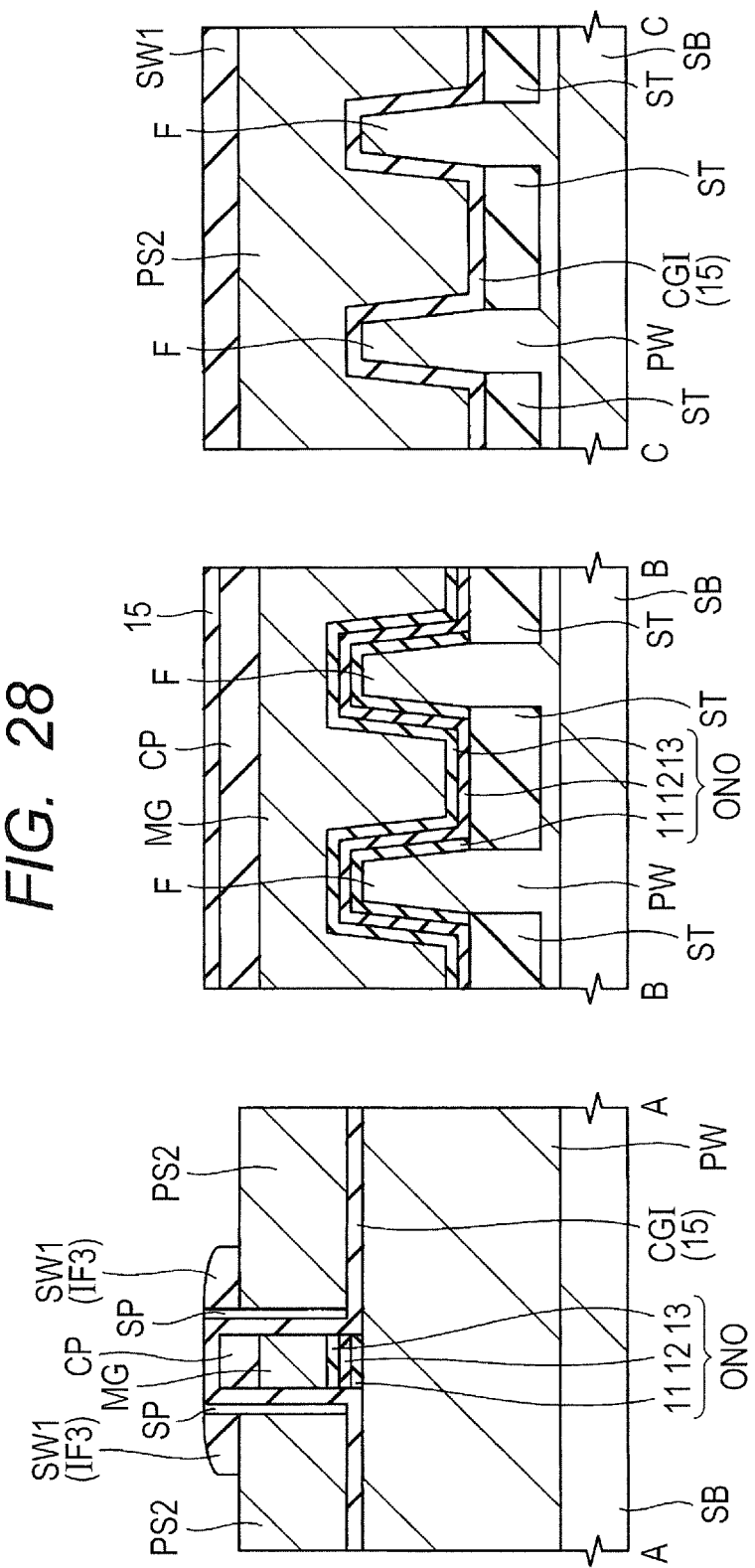
FIG. 28 is a sectional view of a semiconductor device in the first embodiment in the course of a formation process.

Subsequently, an insulating film IF3 for side wall SW1 formation (for example, a silicon nitride film or the like of approximately 50 nm) is formed over the insulating film 15 and the polysilicon film PS2 as shown in FIG. 27 using CVD or the like and is etched back. At this etch back step, the insulating film IF3 is removed by an amount equivalent to a predetermined film thickness from the surface thereof by anisotropic dry etching. As the result of this step, it is possible to leave the insulating film IF3 like side walls in the side wall portions at the upper part of the spacer SP to make side walls SW1 (FIG. 28).

Subsequently, the polysilicon film PS2 located in a lower layer is etched using the side walls SW1 as a mask to form the control gate electrode CG as shown in FIG. 29. The polysilicon film PS2 remains on both sides of the memory gate electrode MG. While the polysilicon film on one side (right side in FIG. 29) serves as the control gate electrode CG, the polysilicon film PS2 on the other side is removed using photolithography and dry etching.

Subsequently, the source region MS and the drain region MD are formed. For example, n-type impurities, such as arsenic (As) or phosphorus (P), are injected into the semiconductor substrate SB (fins F) using the insulating film 15 over the memory gate electrode MG and the side walls SW1 and spacer SP over the control gate electrode CG as a mask to form an $n^-$-type semiconductor region EX. At this time, the $n^-$-type semiconductor region EX is formed by self-alignment to the spacer SP of the side walls of the memory gate electrode MG. Further, the $n^-$-type semiconductor region EX is formed by self-alignment to the side walls of the control gate electrode CG.

Figure 30:
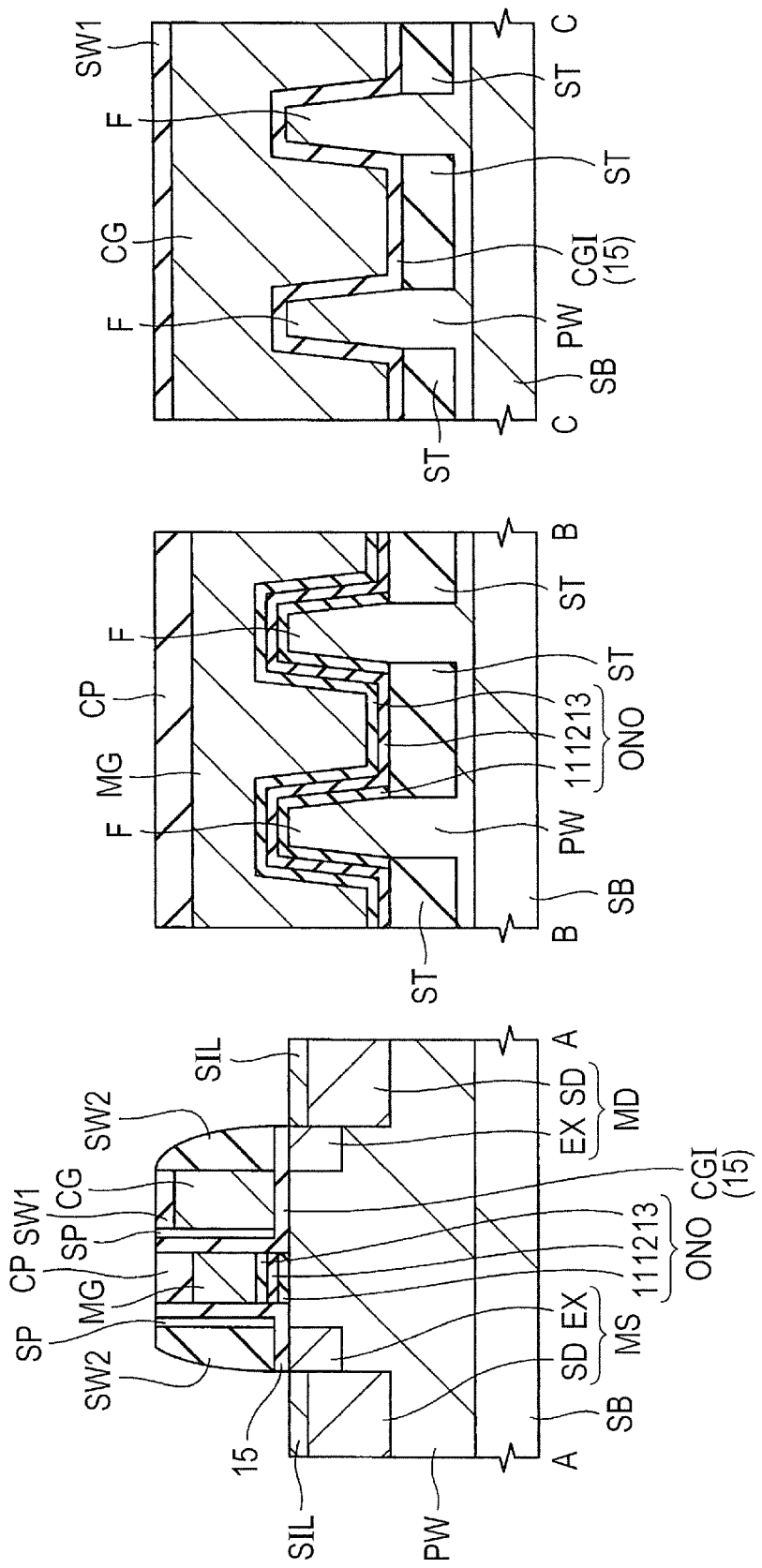
FIG. 30 is a sectional view of a semiconductor device in the first embodiment in the course of a formation process.

Subsequently, a side wall SW2 is formed at the side wall portions of the memory gate electrode MG and the control gate electrode CG as shown in FIG. 30. For example, a silicon nitride film having a film thickness of approximately 40 nm is formed over the insulating film 15 and the side walls SW1 using CVD or the like. This silicon nitride film is removed by an amount equivalent to a predetermined film thickness from the surface thereof by anisotropic dry etching to form the side walls SW2. Subsequently, the insulating film 15 is etched until the cap insulating film CP is exposed. At this time, the insulating film 15 over the $n^-$-type semiconductor region EX or the upper parts of the side walls SW2 may be etched.

Subsequently, n-type impurities, such as arsenic (As) or phosphorus (P), are injected into the semiconductor substrate SB (fins F) using the cap insulating film CP over the memory gate electrode MG, the side walls SW1 over the control gate electrode CG, and the side walls SW2 as a mask. An $n^+$-type semiconductor region SD is thereby formed. At this time, the $n^+$-type semiconductor region SD is formed by self-alignment to the side walls SW2. This $n^+$-type semiconductor region SD is higher in impurity concentration and deeper in junction depth than the $n^-$-type semiconductor region EX. As the result of this step, the source region MS and the drain region MD comprised of the $n^-$-type semiconductor region EX and the $n^+$-type semiconductor region SD are formed.

The $n^+$-type semiconductor region SD may be formed by forming an epitaxial layer containing n-type impurities over the fins F in the $n^+$-type semiconductor region SD formation region. Thereafter, heat treatment is performed to activate the impurities injected so far, such as the n-type impurities to the $n^-$-type semiconductor region EX and the $n^+$-type semiconductor region SD.

Subsequently, a metal silicide film SIL is formed over the source region MS and the drain region MD using a salicide technique.

For example, a metal film (not shown) is formed over the semiconductor substrate SB (fins F) including the areas over the source region MS and the drain region MD and the semiconductor substrate SB (fins F) is heat-treated. The source region MS and the drain region MD are thereby caused to react with the metal film. As a result, the metal silicide film SIL is formed. The above-mentioned metal film is comprised of nickel (Ni), a nickel platinum (Pt) alloy, or the like and can be formed using sputtering or the like. Thereafter, an unreacted metal film is removed. Owing to this metal silicide film SIL, diffusion resistance, contact resistance, and the like can be reduced. The metal silicide film may be formed also over the memory gate electrode MG and the control gate electrode CG.

Figure 31:
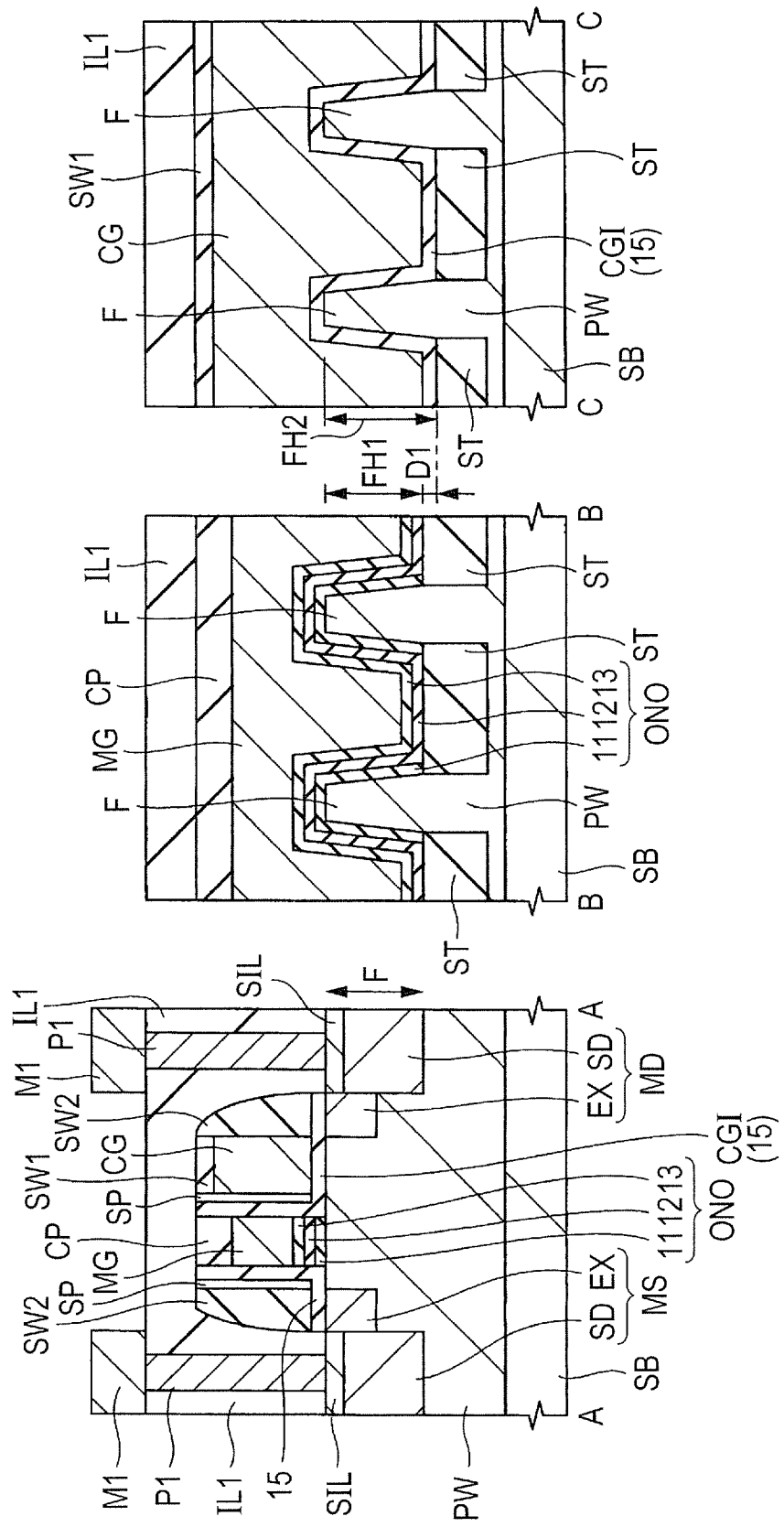
FIG. 31 is a sectional view of a semiconductor device in the first embodiment in the course of a formation process.

Subsequently, a silicon oxide film is deposited as the interlayer insulating film IL1 above the control gate electrode CG, the memory gate electrode MG, and the like using CVD or the like as shown in FIG. 31. Subsequently, plugs P1 are formed in the silicon oxide film and a wiring M1 is formed over the plugs P1. The plug P1 can be formed by, for example, burring a conductive film in a contact hole in the interlayer insulating film IL1. The wiring M1 can be formed by, for example, patterning the conductive film formed over the interlayer insulating film IL1. Thereafter, the steps of forming the interlayer insulating film, the plugs, and the wirings may be repeated.

The semiconductor device in this embodiment can be formed by the above-mentioned steps.

Second Embodiment

In the semiconductor device in the first embodiment, the control gate electrode CG is formed of the polysilicon film PS2 but the control gate electrode CG may be formed of a metal electrode film. The transistor in which the gate electrode is formed of a metal electrode film and the gate insulating film is formed of a high-k insulating film is referred to as a high-k/metal configuration-applied transistor. An example of the high-k insulating film is a high-permittivity film (high dielectric film) higher in relative permittivity than the silicon nitride film.

FIG. 32 to FIG. 37 are sectional views of a semiconductor device in this embodiment in the course of a formation process. A description will be given to the configuration of the semiconductor device in this embodiment with reference to FIG. 37, which is the sectional view illustrating the final step among FIG. 32 to FIG. 37. Parts corresponding to those in the first embodiment will be marked with identical reference numerals and a description thereof will be omitted.

(Explanation of Structure)

Also in the semiconductor device in this embodiment (FIG. 37), a memory cell includes a control transistor having a control gate electrode CG and a memory transistor having a memory gate electrode MG. A side wall SW2 formed of an insulating film is formed in a side wall portion of a synthetic pattern of the memory gate electrode MG and the control gate electrode CG.

Specifically, the memory cell includes: the control gate electrode CG placed above a semiconductor substrate SB (fins F); and the memory gate electrode MG placed above the semiconductor substrate SB (fins F) and adjoining to the control gate electrode CG. Here, for example, the memory gate electrode MG is formed of a silicon film and the control gate electrode CG is formed of a metal electrode film. For the metal electrode film, for example, a laminated film of a TiAl film and an Al film provided thereover can be used and aside therefrom, an Al film, a W film, or the like may also be used.

A control gate insulating film CGI is placed between the control gate electrode CG and the semiconductor substrate SB (fins F). This control gate insulating film CGI is also placed between the control gate electrode CG and the memory gate electrode MG and between the control gate electrode CG and the side walls SW2. The control gate insulating film CGI is formed of a high-k insulating film. For the high-k insulating film, for example, a hafnium oxide film, an aluminum oxide film, or the like can be used.

The memory cell further includes an insulating film ONO (11, 12, 13) located between the memory gate electrode MG and the semiconductor substrate SB (fins F). The insulating film ONO is comprised of, for example, a lower layer insulating film 11, an intermediate layer insulating film 12 located thereover, and an upper layer insulating film 13 located thereover. The intermediate layer insulating film 12 serves as a charge storage part. The lower layer insulating film 11 is formed of, for example, a silicon oxide film. The intermediate layer insulating film 12 is formed of, for example, a silicon nitride film. The upper layer insulating film 13 is formed of, for example, a silicon oxinitride film.

The memory cell further includes a drain region MD and a source region MS formed in a fin F of the semiconductor substrate SB.

A metal silicide film SIL is formed in the upper parts of the drain region MD ($n^+$-type semiconductor region SD) and the source region MS ($n^+$-type semiconductor region SD). A metal silicide film SIL is formed in the upper part of the memory gate electrode MG.

Figure 37:
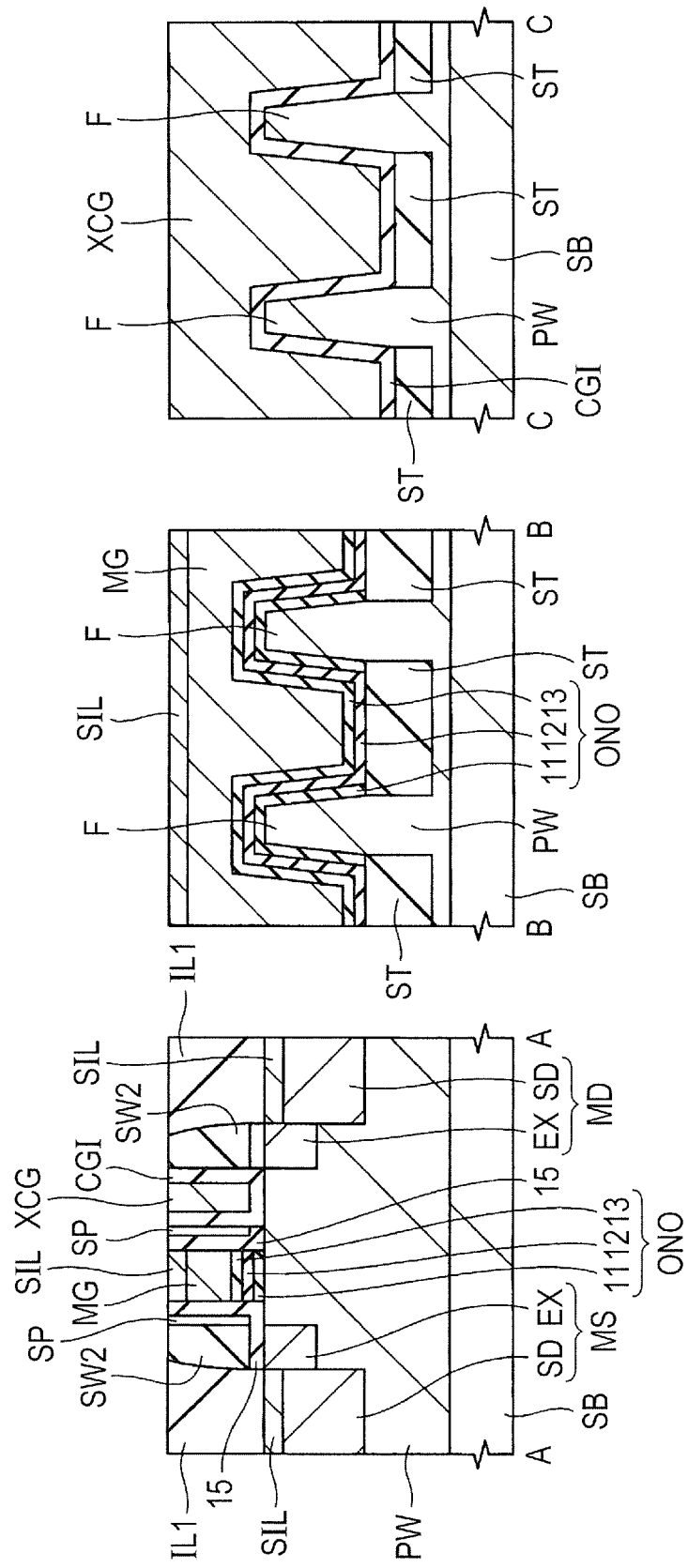
FIG. 37 is a sectional view of a semiconductor device in the second embodiment in the course of a formation process.

Though not shown in FIG. 37, an interlayer insulating film is formed above the control gate electrode CG and the memory gate electrode MG. This film is formed of, for example, a silicon oxide film. Plugs are formed in the interlayer insulating film and a wiring is formed over the plugs.

The basic operations of the memory cell are the same as the (1) readout, (2) erasing, and (3) writing operations described in connection with the first embodiment.

Also in this embodiment, as shown in FIG. 37, the height of the element isolation part ST below the memory gate electrode MG and the height of the element isolation part ST below the control gate electrode CG are different from each other. The height of the element isolation part ST below the memory gate electrode MG is higher than the height of the element isolation part ST below the control gate electrode CG.

As described in connection with the first embodiment, a mismatch between electron injection and hole injection is improved, rewriting operation speed is accelerated, and reliability is enhanced by making the height of the element isolation part ST below the memory gate electrode MG higher than the height of the element isolation part ST below the control gate electrode CG as mentioned above.

(Explanation of Manufacturing Process)

Hereafter, a description will be given to a manufacturing method for a semiconductor device in this embodiment with reference to FIG. 32 to FIG. 37.

First, the fins F are formed as described with reference to FIG. 6 to FIG. 17 in connection with the first embodiment.

Figure 32:
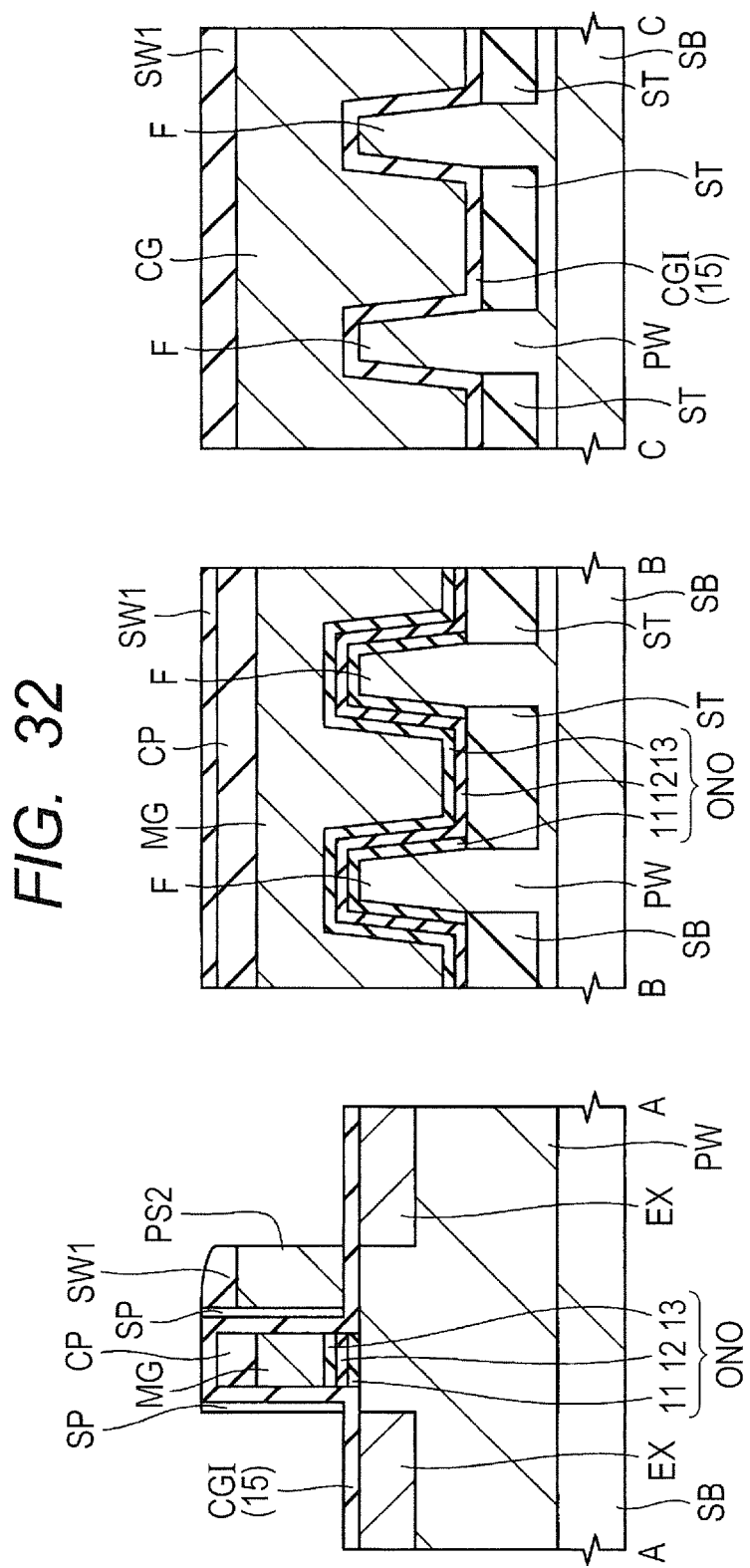
FIG. 32 is a sectional view of a semiconductor device in a second embodiment in the course of a formation process.

Subsequently, as described with reference to FIG. 18 to FIG. 29 in connection with the first embodiment, the element isolation parts ST are formed (FIG. 20); the insulating film ONO (11, 12, 13), the memory gate electrode MG, and the cap insulating film CP are formed (FIG. 22); and further, the upper face of each element isolation part ST between fins is depressed in the control gate electrode CG formation region (FIG. 23). Subsequently, the insulating film 15 is formed; the spacers (side wall insulating films) SP are formed; and then the polysilicon film (conductive film) PS2 is formed. In this embodiment, the polysilicon film PS2 is a film (also referred to as dummy gate) for replacement with the control gate electrode and the insulating film 15 is a film for replacement with the control gate insulating film. Subsequently, the upper face of the polysilicon film PS2 is subjected to etching to depress (lower) the upper face of the polysilicon film PS2 and the side wall SW1 is formed in a side wall portion in the upper parts of the spacers SP over the polysilicon film PS2 (FIG. 28). Subsequently, the polysilicon film PS2 located in a lower layer is etched using the side walls SW1 as a mask to form the control gate electrode CG. Subsequently, the $n^-$-type semiconductor region EX is formed (FIG. 29, FIG. 32).

Figure 33:
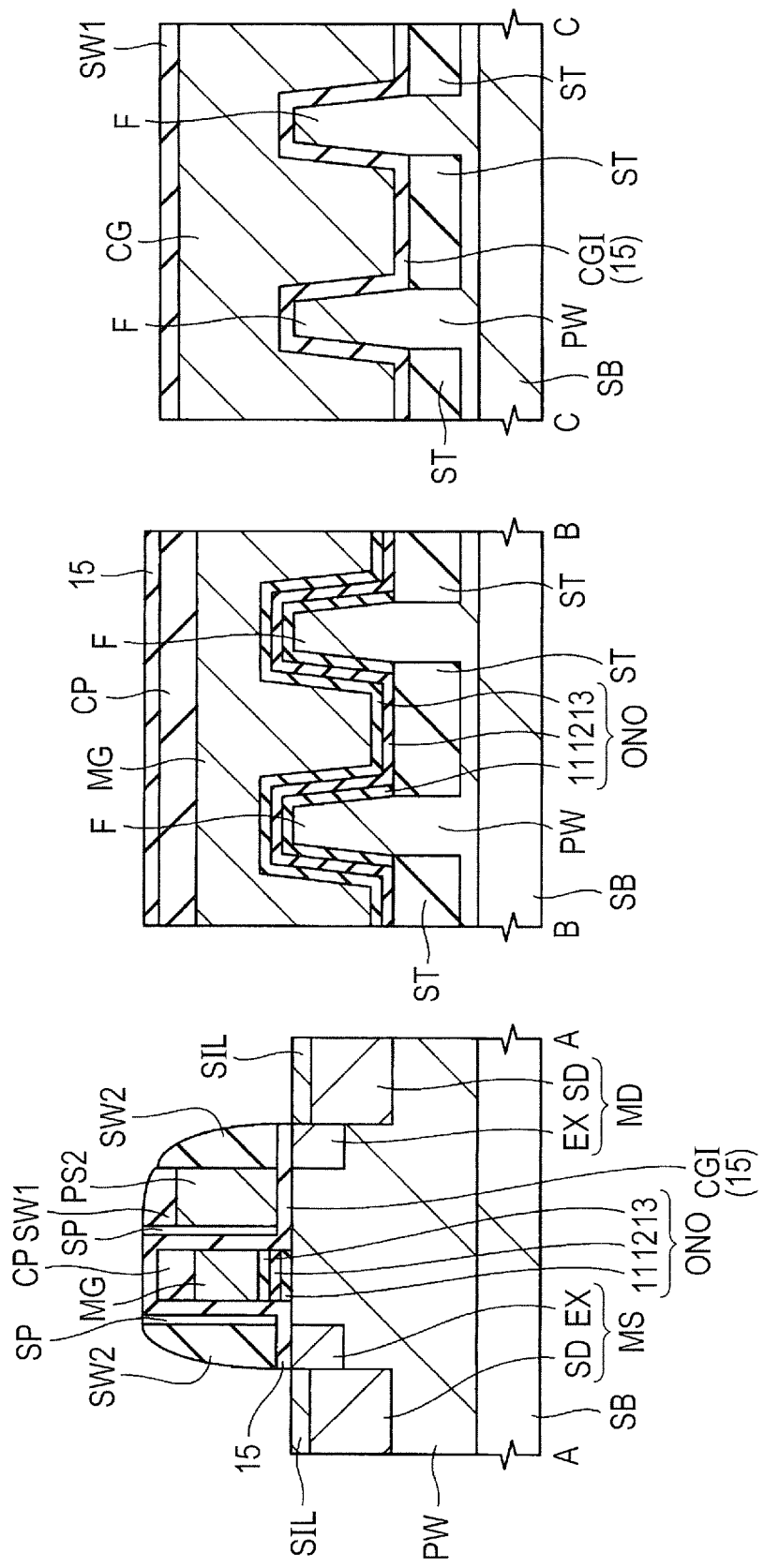
FIG. 33 is a sectional view of a semiconductor device in the second embodiment in the course of a formation process.

Subsequently, the side walls SW2 are formed in side wall portions of the memory gate electrode MG and the control gate electrode CG as shown in FIG. 33. For example, a silicon nitride film having a film thickness of approximately 40 nm is deposited over the insulating film 15 and the side walls SW1 using CVD or the like. This silicon nitride film is removed by an amount equivalent to a predetermined film thickness from the surface thereof by anisotropic dry etching to form the side walls SW2. Subsequently, as in the first embodiment, the $n^+$-type semiconductor region SD is formed and the metal silicide film SIL is then formed.

Figure 34:
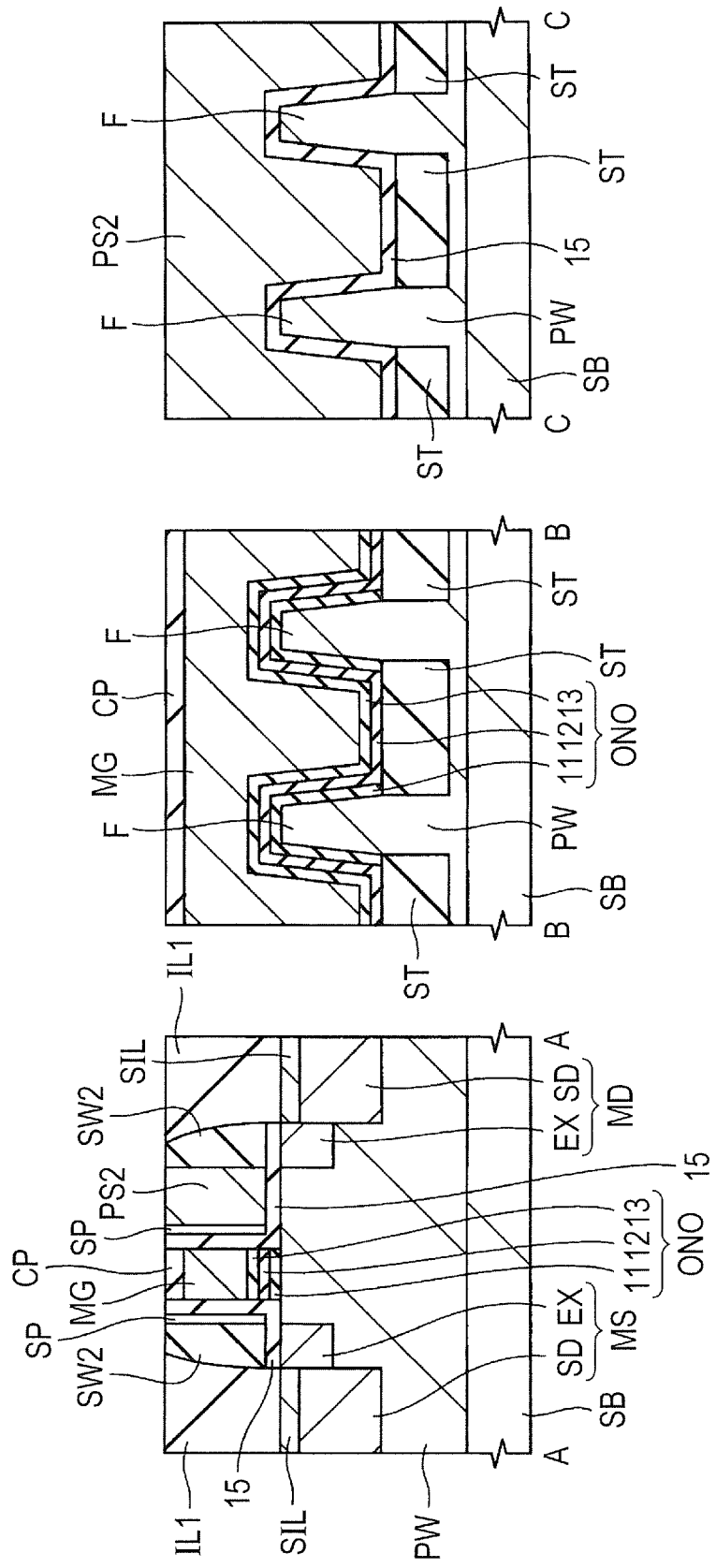
FIG. 34 is a sectional view of a semiconductor device in the second embodiment in the course of a formation process.

Subsequently, a silicon oxide film is deposited as the interlayer insulating film IL1 over the control gate electrode CG, the memory gate electrode MG, and the like using CVD or the like as shown in FIG. 34. Subsequently, the insulating film 15 and a layer located thereunder are planarized by CMP until the polysilicon film PS2 as a film for replacement with the control gate electrode is exposed. At this time, the upper parts of the side walls SW2 may be planarized.

Figure 35:
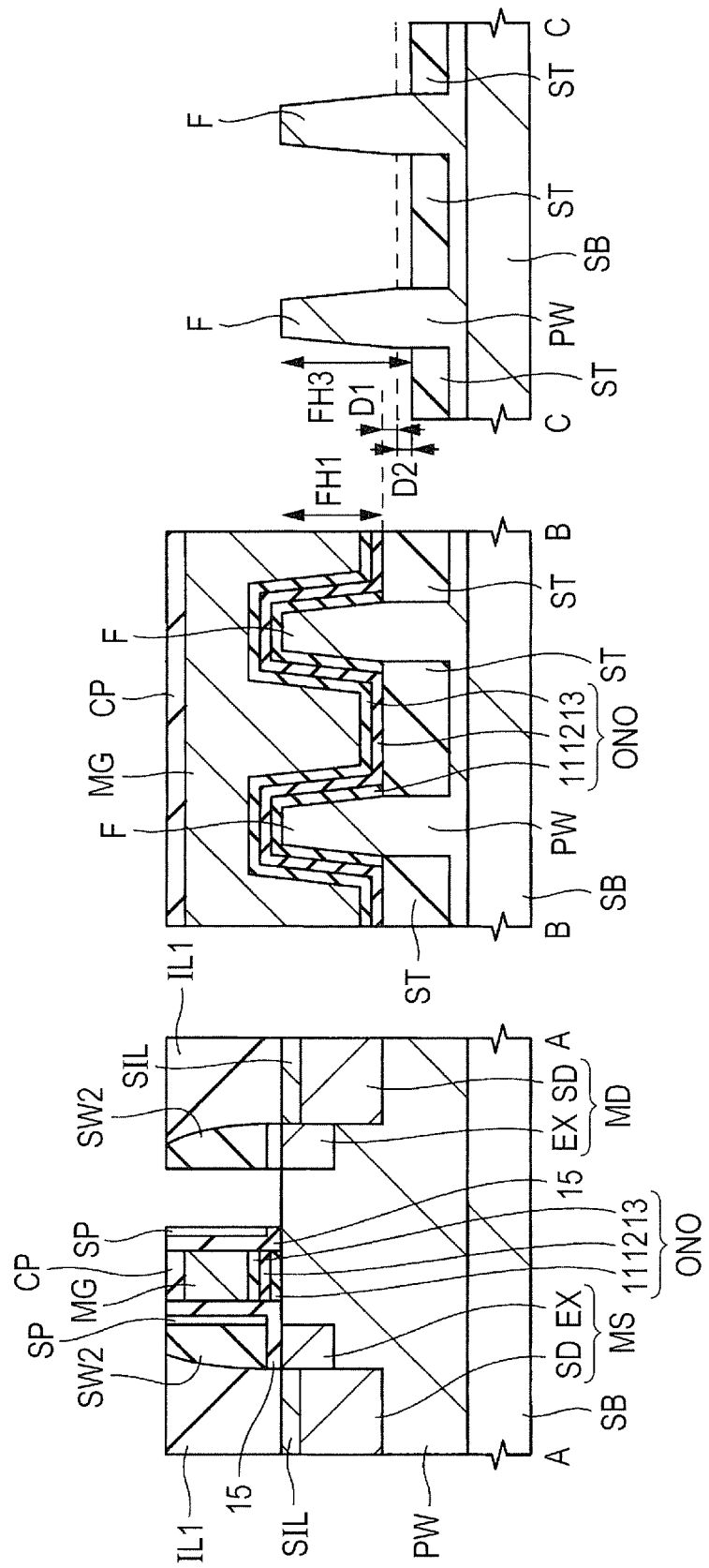
FIG. 35 is a sectional view of a semiconductor device in the second embodiment in the course of a formation process.

Subsequently, as shown in FIG. 35, the exposed polysilicon film PS2 is removed by etching and further the insulating film 15 located below the polysilicon film PS2 is etched. For this etching, dry etching or wet etching can be used. As a result, a trench is formed in an area where the polysilicon film PS2 and the insulating film 15 located thereunder have been removed, over a p-type well PW.

Here, the upper face of each element isolation part ST between fins F can be further depressed in the C-C section (control gate electrode CG formation region) by overetching the insulating film 15. The amount of depression in this step is set to D2.

As a result, the difference in height between the upper face of the element isolation part ST in the control gate electrode CG formation region and the upper face of the element isolation part ST in the memory gate electrode MG formation region can be increased from "D1" to "D1+D2." Here, the height of each fin F in the memory gate electrode MG formation region is FH1 and the height of each fin F in the control gate electrode CG formation region is FH3 (FH3>FH1). In this stage, the difference in height (D1+D2) may be not less than 5 nm and not more than 10 nm but may be not less than 10 nm. In this embodiment, the side faces of the memory gate electrode MG and the insulating film ONO (11, 12, 13) are covered with the insulating film 15 and the spacers SP; therefore, side etching is less prone to occur in the insulating film ONO (11, 12, 13). For this reason, a large amount of depression can be ensured in the upper face of each element isolation part ST.

In this embodiment, as mentioned above, the upper face of each element isolation part ST between fins F can be depressed in the C-C section (control gate electrode CG formation region) by the steps of etching the lower layer insulating film (silicon oxide film) 11 in the insulating film ONO and etching the insulating film 15 as a film for replacement with the control gate insulating film.

Figure 36:
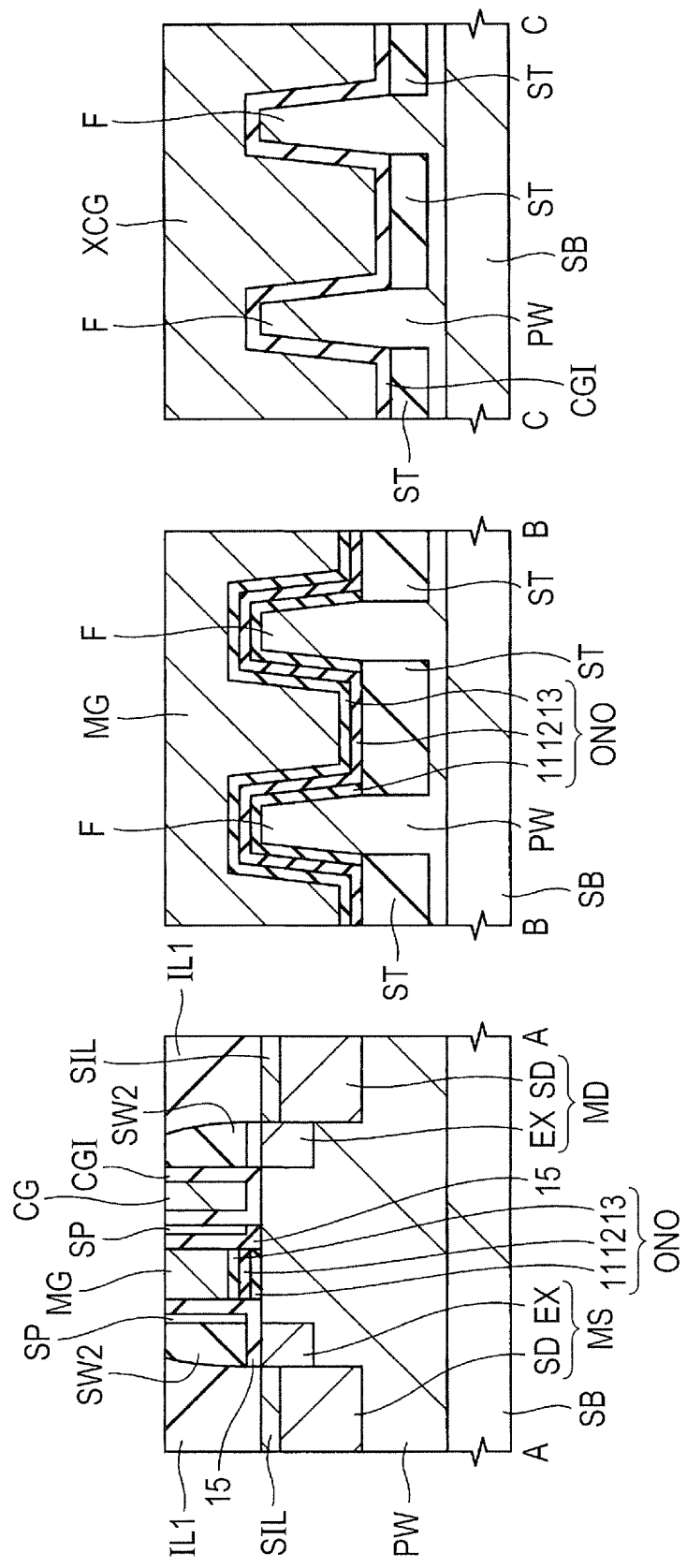
FIG. 36 is a sectional view of a semiconductor device in the second embodiment in the course of a formation process.

Subsequently, the control gate insulating film CGI and the control gate electrode CG are formed in the above-mentioned trenches as shown in FIG. 36. First, a high-permittivity film and a metal film are formed over the semiconductor substrate SB including the interior of each trench in this order to bury a laminated film of the high-permittivity film and the metal film in the trenches. Subsequently, an excess of the laminated film in the upper parts of the trenches is removed using CMP or the like. At this time, the cap insulating film CP over the memory gate electrode MG is also removed to expose the upper face of the memory gate electrode MG. As a result, the control gate insulating film CGI comprised of a high-permittivity film and the control gate electrode CG comprised of a metal film are formed in the above-mentioned trenches.

Subsequently, the metal silicide film SIL is formed over the exposed memory gate electrode MG using a salicide technique as shown in FIG. 37.

Though illustration is omitted, thereafter, the interlayer insulating film, the plugs, the wirings, and the like are formed as in the first embodiment.

The semiconductor device in this embodiment can be formed by the above-mentioned steps.

Third Embodiment

In the first embodiment, the difference in height between the upper face of the element isolation part ST in the control gate electrode CG formation region and the upper face of the element isolation part ST in the memory gate electrode MG formation region is controlled to 10 nm or less with side etching in the insulating film ONO (11, 12, 13) below the memory gate electrode MG taken into account. In this embodiment, meanwhile, a side wall SW10 is provided on the side faces of the insulating film ONO to ensure a large amount of depression (the above-mentioned difference in height) in the upper face of each element isolation part ST.

Figure 38:
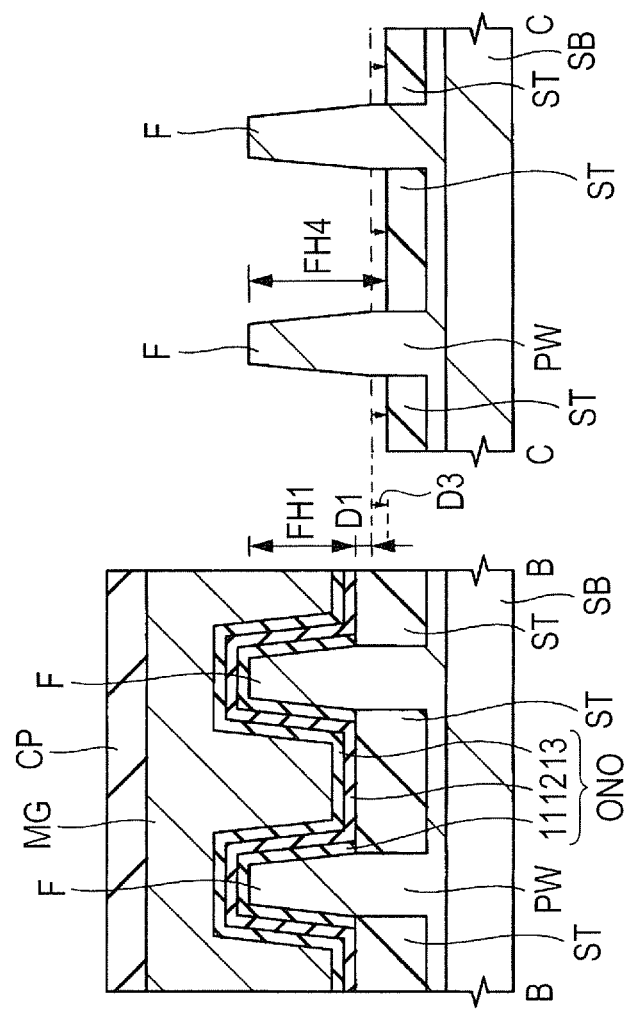
FIG. 38 is a sectional view of a semiconductor device in a third embodiment in the course of a formation process.
Figure 39:
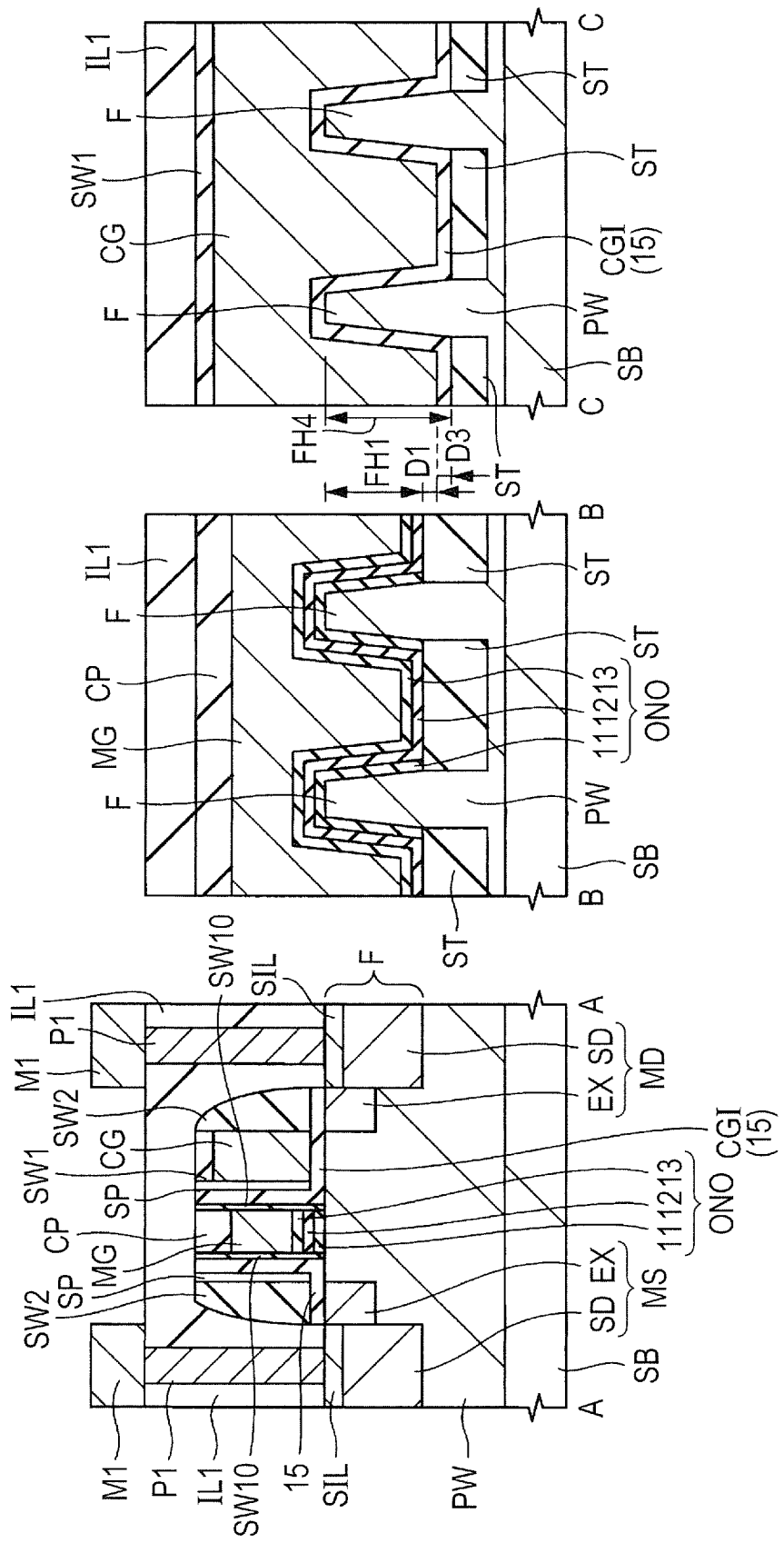
FIG. 39 is a sectional view of a semiconductor device in the third embodiment in the course of a formation process.

FIG. 38 and FIG. 39 are sectional views of a semiconductor device in this embodiment in the course of a formation process.

First, as described with reference to FIG. 21 to FIG. 23 in connection with the first embodiment, the memory gate electrode MG is formed in the C-C section (control gate electrode CG formation region). While doing this, the insulating film ONO (11, 12, 13) is removed by etching and further, the upper face of each element isolation part ST is depressed. At this point of time, the amount of depression, that is, the difference in height between the upper face of the element isolation part ST in the control gate electrode CG formation region and the upper face of the element isolation part ST in the memory gate electrode MG formation region is D1.

Subsequently, as shown in FIG. 38, an insulating film for side wall SW10 formation (for example, a silicon nitride film of approximately 2 nm or the like) is formed over the semiconductor substrate SB using CVD or the like and this insulating film is etched back by anisotropic dry etching. As a result, the side faces of the memory gate electrode MG and the insulating film ONO (11, 12, 13) are covered with a side wall SW10. Thereafter, the upper face of each element isolation part ST between fins F is further depressed in the C-C section (control gate electrode CG formation region). The amount of depression in this step is set to D3. According to this embodiment, a large amount of depression can be ensured in the upper face of each element isolation part ST.

Thereafter, the semiconductor device in this embodiment can be formed as in the first embodiment (FIG. 39).

Fourth Embodiment

In the description of the first to third embodiments, the upper face of the element isolation part ST below the control gate electrode CG and the upper face of the element isolation part ST below the memory gate electrode MG are even and flat but the upper face of each area may have irregularities.

Figure 40:
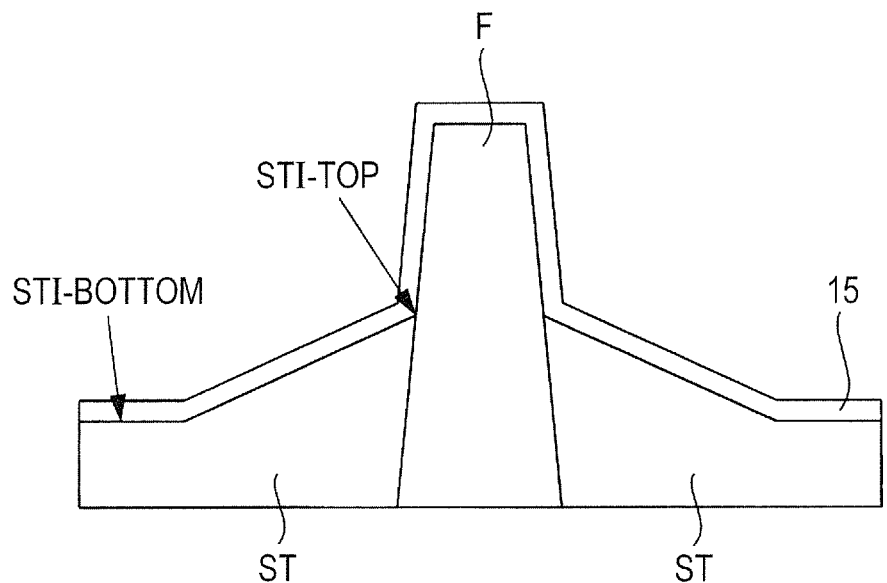
FIG. 40 is a sectional view illustrating the configuration of a memory cell of a semiconductor device in a fourth embodiment.
Figure 41:
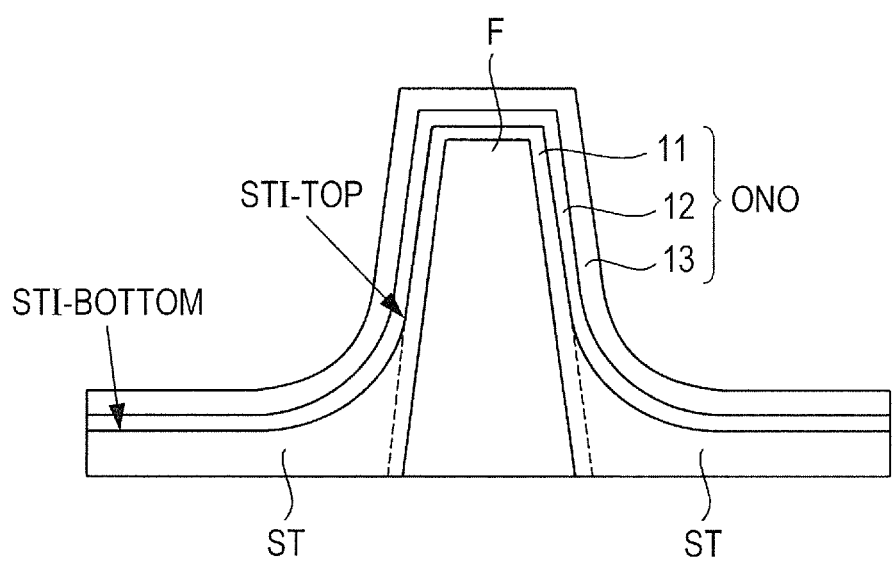
FIG. 41 is a sectional view illustrating the configuration of a memory cell of a semiconductor device in the fourth embodiment.

FIG. 40 and FIG. 41 are sectional views illustrating the configuration of a memory cell of a semiconductor device in this embodiment. FIG. 40 shows the vicinity of the control gate electrode CG and FIG. 41 shows the vicinity of the memory gate electrode MG.

As shown in FIG. 40, the element isolation parts ST on both sides of a fin F gently rise along the fin F in proximity to the fin F. The height of each element isolation part is lowered as it goes away from the fin F. Therefore, in the element isolation part ST below the control gate electrode CG, the substantially center area between fins F is lowest in height and the element isolation part is increased in height as it goes closer to a fin F. Here, the height of the element isolation part ST in the substantially center area between fins F is taken as STI-BOTTOM and the position where the film thickness of the insulating film starts to increase on a side face of a fin F is taken as STI-TOP. That is, a part in which the film thickness of a synthetic film (synthetic portion) of the insulating film 15 and the element isolation film (ST) starts to increase on a side face of a fin F is STI-TOP.

As shown in FIG. 41, the element isolation parts ST on both sides of a fin F gently rise along the fin F in proximity to the fin F. The height of each element isolation part is lowered as it goes away from the fin F. Therefore, in the element isolation part ST below the memory gate electrode MG, the substantially center area between fins F is lowest in height and the element isolation part is increased in height as it goes closer to a fin F. Here, the height of the element isolation part ST in the substantially center area between fins F is taken as STI-BOTTOM and the position where the film thickness of the insulating film starts to increase on a side face of a fin F is taken as STI-TOP. That is, a part in which the film thickness of a synthetic film (synthetic portion) of the insulating film ONO and the element isolation film (ST) starts to increase on a side face of a fin F is STI-TOP.

Here, the height of the element isolation part ST below the memory gate electrode MG and the height of the element isolation part ST below the control gate electrode CG can be set to the above-mentioned STI-TOP. When the memory gate electrode MG is high in height at least with respect to the above-mentioned STI-TOP, a mismatch between electron injection and hole injection described with reference to FIG. 4 and FIG. 5 can be improved.

Needless to add, the height of the element isolation part ST below the memory gate electrode MG and the height of the element isolation part ST below the control gate electrode CG may be set to a height of STI-BOTTOM or obtained by averaging the irregularities. When the element isolation part ST below the control gate electrode CG is etched, these heights are substantially evenly depressed and may be used as a basis.

Up to this point, the invention made by the present inventors has been specifically described based on embodiments of the invention. However, the present invention is not limited to the above-mentioned embodiments and can be variously modified without departing from the subject matter thereof, needless to add.

Some examples will be taken. In the description of the above embodiments, a BTBT erasing scheme is taken as an example. Even when a so-called FN erasing scheme is used, a mismatch between electron injection and hole injection can be improved according to the configurations of the above embodiments.

The semiconductor devices described based on the above embodiments may also include other elements than memory cells. For example, FINFET may be provided. The FINFET includes: a gate electrode extending across fins; a gate insulating film placed between the fins and the gate electrode; and source and drain regions formed in fins on both sides of the gate electrode. The gate electrode, gate insulating film, or source and drain regions configuring the FINFET can be formed by the same steps as those for each constituent part of the memory cell described in connection with the above embodiments using the same materials as those thereof.

What is claimed is:

1. A semiconductor device comprising:
   a first fin in a rectangular parallelepiped shape extending in a first direction;
   a second fin in a rectangular parallelepiped shape placed at a distance from the first fin and extending in the first direction;
   an element isolation part which is placed between the first fin and the second fin and whose height is lower than the height of each of the first fin and the second fin;
   a memory gate electrode placed over the first fin, the element isolation part, and the second fin with a first gate insulating film having a charge storage part in between and extending in a second direction intersecting with the first direction; and
   a control gate electrode placed over the first fin, the element isolation part, and the second fin with a second gate insulating film in between, extending in the second direction, and disposed parallel to the memory gate electrode,
   wherein the height of the element isolation part below the memory gate electrode is higher than the height of the element isolation part below the control gate electrode.

2. The semiconductor device according to claim 1,
   wherein the first gate insulating film includes:
   a first film formed over the first fin,
   a second film, which is the charge storage part, formed over the first film, and
   a third film formed over the second film.

3. The semiconductor device according to claim 2,
   wherein a difference between the height of the element isolation part below the memory gate electrode and the height of the element isolation part below the control gate electrode is not less than 5 nm and not more than 10 nm.

4. The semiconductor device according to claim 2,
   wherein the memory gate electrode and the control gate electrode are formed of silicon.

5. The semiconductor device according to claim 4,
   wherein the first film is a thermal oxidation film and the element isolation part is comprised of a CVD film.

6. The semiconductor device according to claim 2,
   wherein the control gate electrode is comprised of a metal film, and the second gate insulating film is comprised of a dielectric having a permittivity greater than that of silicon nitride.

7. The semiconductor device according to claim 2,
   wherein the height of the element isolation part below the memory gate electrode corresponds to the height of a portion of a first synthetic part of the first film and the element isolation part where the film thickness of the first synthetic part starts to increase, and
   wherein the height of the element isolation part below the control gate electrode corresponds to the height of a portion of a second synthetic part of the second gate insulating film and the element isolation part where the film thickness of the second synthetic part starts to increase.

8. A manufacturing method for a semiconductor device comprising:
   (a) forming, in a semiconductor substrate having a first fin formation region extending in a first direction and a second fin formation region disposed at a distance from the first fin formation region and extending in the first direction, an isolation trench between the first fin formation region and the second fin formation region and further forming a first fin and a second fin;
   (b) burying an isolation insulating film in the isolation trench to form an element isolation part;
   (c) depressing a surface of the element isolation part;
   (d) forming a first insulating film having a charge storage part over the semiconductor substrate, and forming and processing a first conductive film over the first insulating film to form a memory gate electrode above the first fin, the element isolation part, and the second fin, the first memory gate electrode extending in a second direction intersecting with the first direction; and
   (e) forming a second insulating film over the semiconductor substrate, and forming and processing a second conductive film over the second insulating film to form a control gate electrode above the first fin, the element isolation part, and the second fin, the control gate electrode extending in the second direction,
   wherein (e) is performed after (d), and
   wherein after (d), the height of the element isolation part below the memory gate electrode is higher than the height of the element isolation part in a formation region over which the control gate electrode is formed in (e).

9. The manufacturing method for a semiconductor device according to claim 8,
   wherein (d) includes:
   (d1) forming the first insulating film and the first conductive film over a formation region for the memory gate electrode and the formation region for the control gate electrode; and
   (d2) removing the first insulating film and the first conductive film in the formation region for the control gate electrode, leaving the first insulating film and the first conductive film in the formation region for the memory gate electrode, and
   wherein at (d2), the surface of the element isolation part exposed in the formation region for the control gate electrode is depressed.

10. The manufacturing method for a semiconductor device according to claim 8,
    wherein (d) includes:
    over the first fin, forming a first film of the first insulating film, over the first film, forming a second film of the first insulating film to be the charge storage part, and over the second film, forming a third film of the first insulating film.

11. The manufacturing method for a semiconductor device according to claim 10, wherein the memory gate electrode and the control gate electrode are comprised of silicon.

12. The manufacturing method for a semiconductor device according to claim 11, wherein the first film at (d) is formed by thermal oxidation, and wherein the isolation insulating film at (b) is formed by CVD.

13. The manufacturing method for a semiconductor device according to claim 10, wherein the height of the element isolation part below the memory gate electrode corresponds to the height of a portion of a first synthetic part of the first film and the element isolation part where the film thickness of the first synthetic part starts to increase, and wherein the height of the element isolation part below the control gate electrode corresponds to the height of a portion of a second synthetic part of the second insulating film and the element isolation part where the film thickness of the second synthetic part starts to increase.

14. The manufacturing method for a semiconductor device according to claim 8, wherein after (d), a difference between the height of the element isolation part below the memory gate electrode and the height of the element isolation part below the control gate electrode is not less than 5 nm and not more than 10 nm.

15. A manufacturing method for a semiconductor device comprising:

(a) forming, in a semiconductor substrate having a first fin formation region extending in a first direction and a second fin formation region disposed at a distance from the first fin formation region and extending in the first direction, an isolation trench between the first fin formation region and the second fin formation region and further forming a first fin and a second fin;

(b) burying an isolation insulating film in the isolation trench to form an element isolation part;

(c) depressing a surface of the element isolation part;

(d) forming a first insulating film having a charge storage part over the semiconductor substrate, and forming a memory gate electrode over the first insulating film, the memory gate electrode being above the first fin, the element isolation part, and the second fin, and extending in a second direction intersecting with the first direction;

(e) forming a second insulating film over the semiconductor substrate, and forming and processing a second conductive film over the second insulating film, the second conductive film being above the first fin, the element isolation part, and the second fin and extending in the second direction; and (f) removing the second conductive film and the second insulating film located thereunder, and forming a high dielectric film, which is comprised of a dielectric having a permittivity greater than that of silicon nitride, and a control gate electrode comprised of a metal film, wherein (e) is performed after (d), and wherein after (d), the height of the element isolation part below the memory gate electrode is higher than the height of the element isolation part in a formation region over which the second conductive film is formed in (e) and over which the control gate electrode is formed in (f), and the difference in height therebetween is a first difference in height.

16. The manufacturing method for a semiconductor device according to claim 15, wherein after the second conductive film and the second insulating film located thereunder are removed in (f), the height of the element isolation part below the memory gate electrode is higher than the height of the element isolation part in the formation region over which the second conductive film was formed, and the difference in height therebetween is a second difference in height larger than the first difference in height.

17. The manufacturing method for a semiconductor device according to claim 16, wherein (d) includes:

(d1) forming the first insulating film and a first conductive film over a formation region for the first conductive film and the formation region for the second conductive film; and (d2) removing the first insulating film and the first conductive film in the formation region for the second conductive film, leaving the first insulating film and the first conductive film in the formation region for the first conductive film, thereby forming the memory gate electrode comprised of the first conductive film, and wherein at (d2), the surface of the element isolation part exposed in the formation region for the second conductive film is depressed.

18. The manufacturing method for a semiconductor device according to claim 17, wherein at (f), the surface of the element isolation part exposed by removing the second conductive film and the second insulating film located thereunder is depressed.

19. The manufacturing method for a semiconductor device according to claim 18, wherein (d) includes:

over the first fin, forming a first film of the first insulating film, over the first film, forming a second film of the first insulating film to be the charge storage part, and over the second film, forming a third film of the first insulating film.

20. The manufacturing method for a semiconductor device according to claim 19, wherein the first film at (d) is formed by thermal oxidation, and wherein the isolation insulating film at (b) is formed by CVD.

* * * * *